(12) United States Patent
Gong et al.

(10) Patent No.: US 11,804,496 B2
(45) Date of Patent: Oct. 31, 2023

(54) TRANSISTOR DEVICE, MANUFACTURING METHOD THEREOF, DISPLAY SUBSTRATE AND DISPLAY DEVICE

(71) Applicants: Hefei BOE Optoelectronics Technology Co., Ltd., Anhui (CN); BOE Technology Group Co., Ltd., Beijing (CN)

(72) Inventors: Kui Gong, Beijing (CN); Li Li, Beijing (CN); Wei Sun, Beijing (CN); Yuhu Zhang, Beijing (CN); Lei Yu, Beijing (CN); Hongwei Wang, Beijing (CN); Ru Xu, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 45 days.

(21) Appl. No.: 17/048,138

(22) PCT Filed: Apr. 22, 2020

(86) PCT No.: PCT/CN2020/086129
§ 371 (c)(1),
(2) Date: Oct. 16, 2020

(87) PCT Pub. No.: WO2020/228499
PCT Pub. Date: Nov. 19, 2020

(65) Prior Publication Data
US 2023/0131513 A1      Apr. 27, 2023

(30) Foreign Application Priority Data
May 16, 2019 (CN) .......................... 201910410880.2

(51) Int. Cl.
*H01L 27/00* (2006.01)
*H01L 27/12* (2006.01)

(52) U.S. Cl.
CPC ........ *H01L 27/1251* (2013.01); *H01L 27/127* (2013.01); *H01L 27/1225* (2013.01); *H01L 27/1262* (2013.01); *H01L 27/1288* (2013.01)

(58) Field of Classification Search
CPC ............. H01L 27/1251; H01L 27/1225; H01L 27/1262; H01L 27/127; H01L 27/1288;
(Continued)

(56) References Cited

U.S. PATENT DOCUMENTS 8,421,090 B2* 4/2013 Choi .................... H01L 27/1225
257/79
10,797,088 B2* 10/2020 Takechi ............. H10K 59/1213
(Continued)

FOREIGN PATENT DOCUMENTS

CN          101053083 A      10/2007
CN          102013432 A       4/2011
(Continued)

OTHER PUBLICATIONS

International search report of PCT application No. PCT/CN2020/086129 dated Jul. 27, 2020.
(Continued)

*Primary Examiner* — Nikolay K Yushin
(74) *Attorney, Agent, or Firm* — Lippes Mathias LLP

(57) ABSTRACT

The present disclosure provides a transistor device, a manufacturing method thereof, a display substrate and a display device. The transistor device includes a base substrate, as well as a first transistor and a second transistor that are disposed on the base substrate. The first transistor includes
(Continued)

a first active layer. The second transistor includes a second gate. The first active layer and the second gate are disposed in the same layer.

15 Claims, 15 Drawing Sheets

(58) Field of Classification Search
CPC ............ H01L 29/0847; H01L 29/1033; H01L 29/401; H01L 29/78618; H01L 27/12; H01L 27/1259

See application file for complete search history.

(56) References Cited

U.S. PATENT DOCUMENTS

| | | | |
|---|---|---|---|
| 2008/0146041 | A1 | 6/2008 | Sasaki |
| 2011/0049507 | A1* | 3/2011 | Choi ................. H01L 27/1251 438/34 |
| 2013/0181222 | A1 | 7/2013 | Liu et al. |
| 2018/0076241 | A1* | 3/2018 | Takechi ............... H01L 27/124 |
| 2020/0295052 | A1 | 9/2020 | Hideo |

FOREIGN PATENT DOCUMENTS

| | | |
|---|---|---|
| CN | 102646676 A | 8/2012 |
| CN | 107731858 A | 2/2018 |
| CN | 107863354 A | 3/2018 |
| CN | 109300915 A | 2/2019 |
| CN | 110098201 A | 8/2019 |
| JP | H01192173 A | 8/1989 |

OTHER PUBLICATIONS

First office action of Chinese application No. 2019104108802 dated Sep. 7, 2020.

Second office action of Chinese application No. 2019104108802 dated Jan. 20, 2021.

* cited by examiner

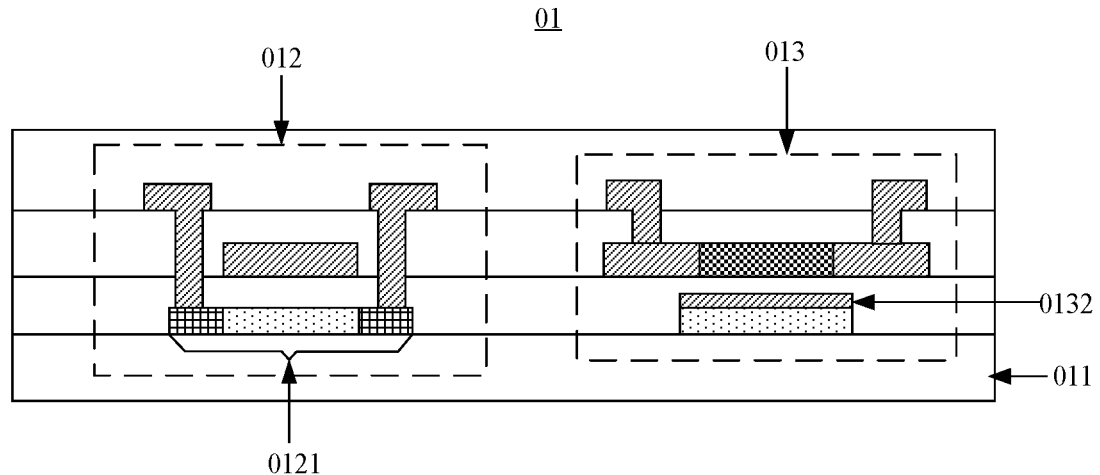
FIG. 1
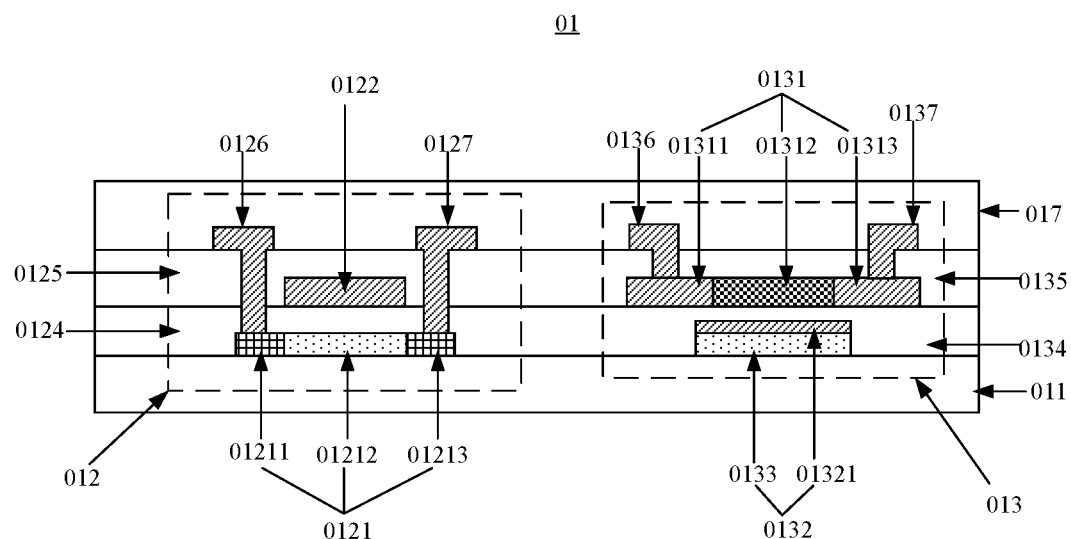
FIG. 2
| 301 |
| --- |
| Forming a first transistor and a second transistor on a base substrate |
FIG. 3

TRANSISTOR DEVICE, MANUFACTURING METHOD THEREOF, DISPLAY SUBSTRATE AND DISPLAY DEVICE

The present disclosure is a 371 of PCT Application No. PCT/CN2020/086129, filed on Apr. 22, 2020, which claims priority to Chinese Patent Application No. 201910410880.2, filed on May 16, 2019 and entitled "TRANSISTOR DEVICE, MANUFACTURING METHOD THEREOF, DISPLAY SUBSTRATE AND DISPLAY DEVICE", the entire contents of which are incorporated herein by reference.

TECHNICAL FIELD

The present disclosure relates to a transistor device, a manufacturing method thereof, a display substrate and a display device.

BACKGROUND

A transistor device plays an important role in a display device, and a low temperature polycrystalline oxide (LTPO) transistor device is a more common transistor device in the display device.

SUMMARY

The present disclosure provides a transistor device, a manufacturing method thereof, a display substrate and a display device. The technical solutions are described as follows.

In a first aspect, a transistor device is provided. The transistor device includes a base substrate, and a first transistor and a second transistor that are on the base substrate.

The first transistor includes a first active layer, and the second transistor includes a second gate, the first active layer and the second gate being in the same layer.

Optionally, a material of the first active layer is different from a material of the second active layer.

Optionally, the material of the first active layer includes polysilicon, and the material of the second active layer includes an oxide semiconductor.

Optionally, the first active layer includes a first source region, a first channel region and a first drain region, and the second gate includes a gate body and a polysilicon block.

The first source region, the first channel region and the first drain region are sequentially arranged along a direction parallel to the base substrate; the polysilicon block and the gate body are sequentially arranged along a direction perpendicular to and away from the base substrate; an orthographic projection of the polysilicon block on the base substrate coincides with an orthographic projection of the gate body on the base substrate; and a material of the first channel region of the first active layer is the same as a material of the polysilicon block.

Optionally, the first transistor is of a top gate structure, and the second transistor is of a bottom gate structure.

Optionally, the first transistor further includes a first gate, and the second transistor further includes a second active layer, wherein the first gate and the second active layer are in the same layer.

Optionally, the second active layer includes a second source region, a second channel region and a second drain region. The second source region, the second channel region and the second drain region are sequentially arranged along a direction parallel to the base substrate, and materials of the second source region and the second drain region in the second active layer are the same as a material of the first gate.

Optionally, the first transistor further includes a first source and drain, a first gate insulating layer and a first source and drain insulating layer, the second transistor further includes a second source and drain, a second gate insulating layer and a second source and drain insulating layer, and the first transistor and the second transistor meet at least one of the following conditions:

the first source and drain and the second source and drain are in the same layer;

the first gate insulating layer and the second gate insulating layer are in the same layer; and the first source and drain insulating layer and the second source and drain insulating layer are in the same layer.

Optionally, the second transistor further includes a second active layer, a second gate insulating layer, and a second source and drain insulating layer; wherein a material of the second active layer includes an oxide semiconductor, and the second gate insulating layer, the second active layer and the second source and drain insulating layer are sequentially arranged along a direction perpendicular to the base substrate; and a material of a part of the second gate insulating layer proximal to the second active layer includes an oxide, and a material of a part of the second source and drain insulating layer proximal to the second active layer includes an oxide.

Optionally, a material of a part of the second gate insulating layer distal from the second active layer includes a non-oxide, and a material of a part of the second source and drain insulating layer distal from the second active layer includes a non-oxide.

In a second aspect, a method for manufacturing a transistor device is provided. The method is applicable to manufacturing the transistor device as defined in the first aspect, and includes:

forming a first transistor and a second transistor on a base substrate;

wherein the first transistor includes a first active layer, and the second transistor includes a second gate, the first active layer and the second gate being in the same layer.

Optionally, the first active layer and the second gate are manufactured in one patterning process.

Optionally, the second transistor further includes a second active layer, wherein a material of the first active layer is different from a material of the second active layer.

Optionally, the material of the first active layer includes polysilicon, and the material of the second active layer includes an oxide semiconductor.

Optionally, forming the first transistor and the second transistor on the base substrate includes:

sequentially forming a polysilicon material layer and a conductor material layer on a base substrate when forming the first active layer and the second gate;

obtaining a polysilicon pattern and a gate body by processing the polysilicon material layer and the conductor material layer in one patterning process; wherein the polysilicon pattern includes a polysilicon block and an auxiliary polysilicon block that are spaced apart, the polysilicon block and the gate body being sequentially arranged along a direction perpendicular to the base substrate and away from the base substrate, and an orthographic projection of the polysilicon block on the base substrate coinciding with an orthographic projection of the gate body on the base substrate; and the second gate includes the polysilicon block and the gate body; and obtaining the first active layer by doping a part of the auxiliary polysilicon block, wherein the first active layer includes a first source region and a first drain region that are subjected to the doping treatment, and a first channel region not subjected to the doping treatment, the first source region, the first channel region and the first drain region being sequentially arranged along a direction parallel to the base substrate.

Optionally, obtaining the polysilicon pattern and the gate body by processing the polysilicon material layer and the conductor material layer in one patterning process includes:

forming a first photoresist pattern on the base substrate on which the polysilicon material layer and the conductor material layer are formed, wherein the first photoresist pattern includes a first photoresist area and a second photoresist area that are spaced apart, the first photoresist area being thinner than the second photoresist area;

obtaining a conductor pattern by removing a part of the conductor material layer not covered with the first photoresist pattern;

obtaining a polysilicon pattern by removing a part of the polysilicon material layer not covered with the first photoresist pattern;

obtaining a second photoresist pattern by removing the photoresist in the first photoresist area and thinning the photoresist in the second photoresist area;

obtaining the gate body by removing a part of the conductor pattern not covered with the second photoresist pattern; and removing the second photoresist pattern.

Optionally, the first transistor is of a top gate structure, and the second transistor is of a bottom gate transistor.

Optionally, the first transistor further includes a first gate, the second transistor further includes a second active layer, and forming the first transistor and the second transistor on the base substrate further includes:

prior to doping the part of the auxiliary polysilicon block, forming an oxide semiconductor material layer on the base substrate on which the polysilicon pattern and the gate body are formed;

forming a third photoresist pattern on the base substrate on which the oxide semiconductor material layer is formed, wherein the third photoresist pattern includes a third photoresist area, a fourth photoresist area, a fifth photoresist area and a sixth photoresist area, the third photoresist area and the fourth photoresist area being spaced apart, the fourth photoresist area, the fifth photoresist area and the sixth photoresist area being sequentially connected, the third photoresist area, the fourth photoresist area and the sixth photoresist area having the same thickness, and the third photoresist area being thinner than the fifth photoresist area;

obtaining an oxide semiconductor pattern by removing a part of the oxide semiconductor material layer not covered with the third photoresist pattern;

obtaining a fourth photoresist pattern by removing the photoresist in the third photoresist area, the fourth photoresist area and the sixth photoresist area, and thinning the photoresist in the fifth photoresist area;

obtaining the first gate and the second active layer by reducing a part of the oxide semiconductor pattern not covered with the fourth photoresist pattern, wherein the second active layer includes a second source region and a second drain region that are subjected to the reduction treatment, and a second channel region not subjected to the reduction treatment, the second source region, the second channel region and the second drain region being sequentially arranged along a direction parallel to the base substrate; and removing the fourth photoresist pattern;

doping the part of the auxiliary polysilicon block includes:

after obtaining the oxide semiconductor pattern, doping the part of the auxiliary polysilicon block by taking the third photoresist pattern as a mask.

Optionally, the first transistor further includes a first gate, the second transistor further includes a second active layer, wherein the first gate and the second active layer are manufactured in one patterning process.

Optionally, the first gate and the second active layer are disposed in the same layer, and forming the first transistor and the second transistor on the base substrate includes:

forming an oxide semiconductor material layer on the base substrate when forming the first gate and the second active layer;

obtaining an oxide semiconductor pattern by processing the oxide semiconductor material layer in one patterning process, wherein the oxide semiconductor pattern includes a target semiconductor block and an auxiliary semiconductor block that are spaced apart; and obtaining the first gate and the second active layer by reducing a part of the target semiconductor block and the auxiliary semiconductor block, wherein the second active layer includes a second source region and a second drain region that are subjected to the reduction treatment, as well as a second channel region not subjected to the reduction treatment, the second source region, the second channel region and the second drain region being sequentially arranged along a direction parallel to the base substrate.

Optionally, the first transistor further includes a first source and drain, a first gate insulating layer and a first source and drain insulating layer, the second transistor further includes a second source and drain, a second gate insulating layer and a second source and drain insulating layer, and forming the first transistor and the second transistor on the base substrate includes:

forming a first insulating material layer on the base substrate when forming the first gate insulating layer and the second gate insulating layer, and obtaining the first gate insulating layer and the second gate insulating layer by processing the first insulating material layer in one patterning process;

forming a second insulating material layer on the base substrate when forming the first source and drain insulating layer and the second source and drain insulating layer, and obtaining the first source and drain insulating layer and the second source and drain insulating layer by processing the second insulating material layer in one patterning process; and forming a conductive material layer on the base substrate when forming the first source and drain and the second source and drain, and obtaining the first source and drain and the second source and drain by processing the conductive material layer in one patterning process.

In a third aspect, a display substrate is provided. The display substrate includes the transistor device as defined in the first aspect.

In a fourth aspect, a display device is provided. The display device includes the display substrate as defined in the third aspect.

BRIEF DESCRIPTION OF DRAWINGS

FIG. 1 is a schematic structural diagram of a transistor device according to an embodiment of the present disclosure;

FIG. 2 is a schematic structural diagram of another transistor device according to an embodiment of the present disclosure;

FIG. 3 is a flow diagram of a method for manufacturing a transistor device according to an embodiment of the present disclosure;

DESCRIPTION OF EMBODIMENTS

Figure 4:
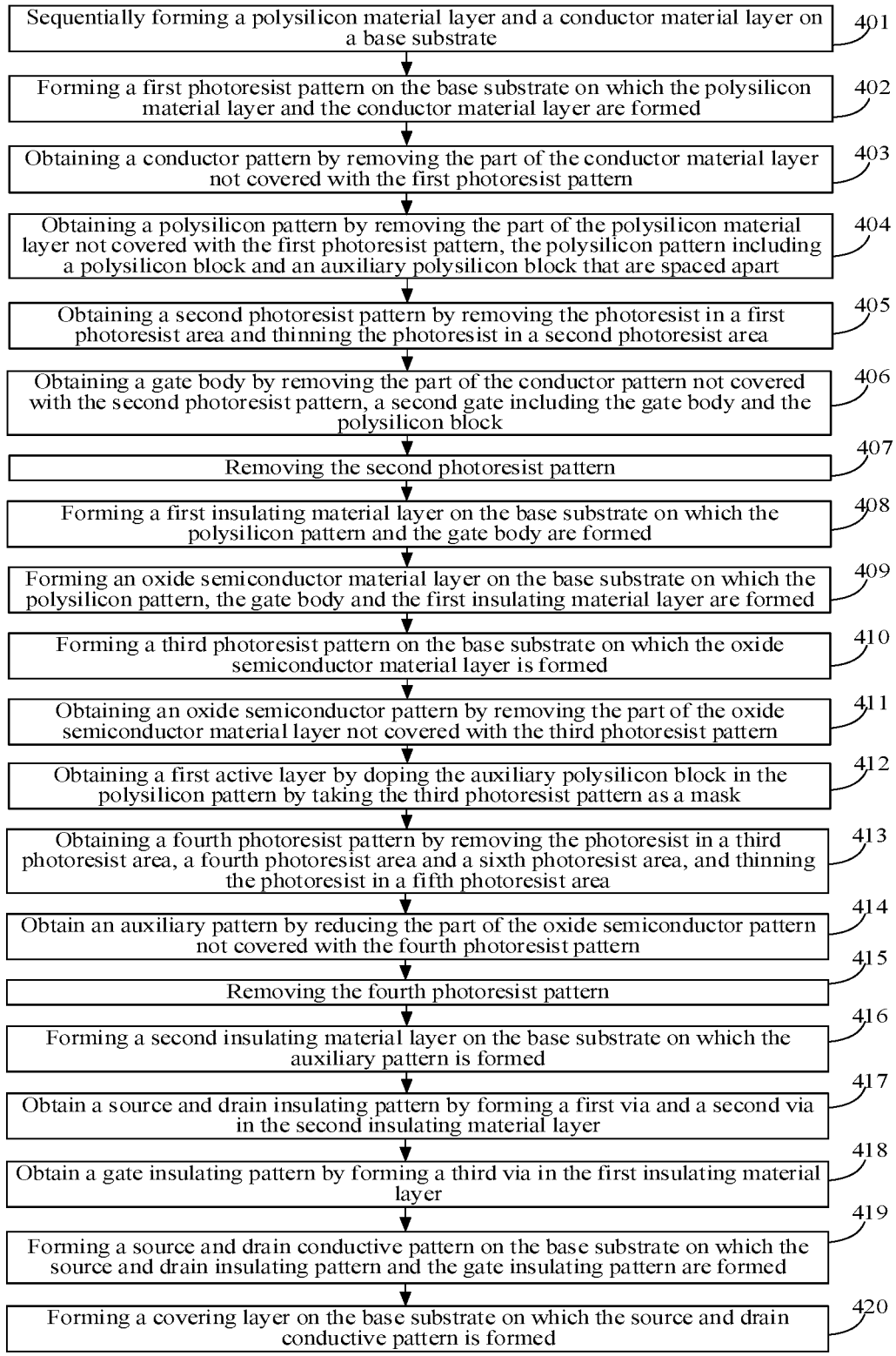
FIG. 4 is a flow diagram of another method for manufacturing a transistor device according to an embodiment of the present disclosure.

To make the principles and the technical solutions of the present disclosure clearer, the embodiments of the present disclosure will be described in detail below with reference to the accompanying drawings.

Exemplarily, FIG. 1 is a schematic structural diagram of a transistor device according to an embodiment of the present disclosure. As shown in FIG. 1, the transistor device includes a base substrate 011, as well as a first transistor 012 and a second transistor 013 that are disposed on the base substrate 011.

The first transistor 012 includes a first active layer 0121, and the second transistor 013 includes a second gate 0132. The first active layer 0121 and the second gate 0132 are disposed in the same layer.

In summary, in the transistor device provided by the present embodiment, the active layer of one transistor and the gate of the other transistor are disposed in the same layer. However, gates and active layers of a plurality of transistors in a transistor device provided by the related art are disposed in different layers. It thus can be seen that the structure of the transistor device provided by the present embodiment is different from a structure of the transistor device in the related art. Therefore, the transistor device provided by the present embodiment is of a brand-new structure.

In the transistor device provided by the present embodiment, there is a plurality of structures disposed in the same layer, for example, the first active layer and the second gate that are disposed in the same layer. It should be noted that when the plurality of structures is disposed in the same layer, one or multiple patterning processes may be adopted to manufacture the plurality of structures, which is not limited in the embodiments of the present disclosure.

Optionally, when the first active layer and the second gate are disposed in the same layer, the first active layer of the first transistor and the second gate of the second transistor may be prepared in only one patterning process instead of multiple patterning processes. However, in traditional technologies, the first active layer of the first transistor and the second gate of the second transistor are disposed in different layers and need to be manufactured by multiple patterning processes. It thus can be seen that compared with the traditional technologies, the transistor device provided by the present embodiment is simple in the manufacturing process, and the production efficiency is improved.

FIG. 2 is a schematic structural diagram of another transistor device according to an embodiment of the present disclosure. As shown in FIG. 2, the second transistor 013 in the above-mentioned transistor device may further include a second active layer 0131 based on FIG. 1. A material of the second active layer 0131 may be the same as or different from a material of the first active layer 0121, which is not limited in the present embodiment. Exemplarily, the present embodiment is described by taking the scenario where the material of the second active layer 0131 is different from the material of the first active layer 0121, the material of the second active layer 0131 includes polysilicon, and the material of the first active layer 0121 includes an oxide semiconductor as an example. Optionally, the example may also be that that the material of the second active layer 0131 includes an oxide semiconductor, and the material of the first active layer 0121 includes polysilicon, which is not limited in the embodiments of the present disclosure.

In the first transistor and the second transistor, the transistor of which the material of the active layer includes polysilicon may be called a Low Temperature Poly Silicon (LTPS) transistor, and the transistor of which the material of the active layer includes an oxide semiconductor may be called an oxide transistor. At this time, the transistor device including the first transistor and the second transistor is called an LTPO transistor device. The LTPS transistor has the advantage of high electron mobility, and the oxide transistor has the advantage of lower leakage current. Therefore, the LTPO transistor device has the advantages of both of high electron mobility and lower leakage current.

Continuing to refer to FIG. 2, the first active layer 0121 may include a first source region 01211, a first channel region 01212 and a first drain region 01213, and the second gate 0132 includes a gate body 01321 and a polysilicon block 0133. The first source region 01211, the first channel region 01212 and the first drain region 01213 are sequentially arranged along a direction parallel to the base substrate 011. The polysilicon block 0133 and the gate body 01321 are sequentially arranged along a direction perpendicular to the base substrate 011 and away from the base substrate 011. An orthographic projection of the polysilicon block 0133 on the base substrate 011 coincides with an orthographic projection of the gate body 01321 on the base substrate 011. A material of the first channel region 01212 of the first active layer 0121 is the same as a material of the polysilicon block 0133.

Since the present embodiment takes the scenario where the material of the first active layer includes polysilicon as an example, the material of the first channel region 01212 of the first active layer may be polysilicon, and the material of the polysilicon block 0133 may also be polysilicon. A material of the first source region 01211 may be the same as a material of the first drain region 01213, for example, materials of the first source region 01211 and the first drain region 01213 include polysilicon doped with P-type ions (such as, boron ions and arsenic ions) or N-type ions (such as, phosphonium ions and gallium ions).

In the present embodiment, the second transistor includes the polysilicon block of which the material is the same as the material of the first channel region, and the first active layer and the second gate are disposed in the same layer, such that the first active layer and the second gate (including the gate body and the polysilicon block) may be manufactured in one patterning process.

Exemplarily, a material of the gate body may be conductor material, such as a pure metal (such as, silver, aluminum, molybdenum, or copper), or a multi-metal laminate material (aluminum and molybdenum, copper and molybdenum, or the like). During manufacture of the first active layer, the gate body and the polysilicon block, a polysilicon material layer and a conductor material layer may be sequentially formed on the base substrate first and then a polysilicon pattern and the gate body are obtained by processing in one patterning process, wherein the polysilicon pattern includes a polysilicon block and an auxiliary polysilicon block that are spaced apart, wherein the polysilicon block and the gate body are sequentially arranged along a direction perpendicular to the base substrate and away from the base substrate, the orthographic projection of the polysilicon block on the base substrate coincides with the orthographic projection of the gate body on the base substrate; and finally, the active layer of the first transistor is obtained by doping a part of the auxiliary polysilicon block, wherein the first active layer includes a first source region and a drain region that are subjected to the doping treatment, and a first channel region not subjected to the doping treatment, the first source region, wherein the first channel region and the first drain region are sequentially arranged along a direction parallel to the base substrate.

During processing of the polysilicon material layer and the conductor material layer in one patterning process, a first photoresist pattern may be first formed on the base substrate on which the polysilicon material layer and the conductor material layer are formed. The first photoresist pattern includes a first photoresist area and a second photoresist area that are spaced apart. The first photoresist area is thinner than the second photoresist area. Then a conductor pattern is obtained by removing a part of the conductor material layer not covered with the first photoresist pattern. A polysilicon pattern is obtained by removing a part of the polysilicon material layer not covered with the first photoresist pattern. The second photoresist pattern is obtained by removing the photoresist in the first photoresist area, and thinning the photoresist in the second photoresist area. The gate body is obtained by removing a part of the conductor pattern not covered with the second photoresist pattern. Finally, the second photoresist pattern is removed.

Optionally, both of the first transistor 012 and the second transistor 013 may be of a top gate structure or a bottom gate structure, or one of the first transistor 012 and the second transistor 013 is of a top gate structure, and the other is of a bottom gate structure, which is not limited in the embodiments of the present disclosure. The present embodiment takes that the first transistor 012 is of a top gate structure and the second transistor 013 is of a bottom gate structure as an example.

In the transistor device shown in FIG. 2, the first transistor 012 further includes a first gate 0122, and the second transistor 013 further includes a second active layer 0131. The first gate 0122 and the second active layer 0131 are disposed in the same layer. In this way, in the transistor device provided by the present embodiment, a gate of each transistor is disposed on the same layer as an active layer of the other transistor.

Optionally, during manufacture of the transistor device, the first gate and the second active layer may be obtained in one patterning process. However, in the traditional technologies, the first gate and the second active layer are disposed in different layers. Therefore, it is necessary to manufacture the first gate and the second active layer respectively in multiple patterning processes. Compared with the traditional technologies, the present embodiment has the advantages that the manufacturing process of the transistor device is further simplified, and the efficiency in producing the transistor device is improved.

Optionally, the second active layer 0131 includes a second source region 01311, a second channel region 01312 and a second drain region 01313 that are sequentially arranged along a direction parallel to the base substrate 011. Materials of the second source region 01311 and the second drain region 01313 in the second active layer 0131 are the same as the material of the first gate 0122.

In the present embodiment, since the materials of the second source region and the second drain region in the second active layer are the same as the material of the first gate, and the second active layer and the first gate are disposed in the same layer, an oxide semiconductor material layer may be formed on the base substrate first, and then the second active layer and the first gate are obtained by processing the oxide semiconductor material layer in one patterning process.

During processing of the oxide semiconductor material layer in one patterning process, a third photoresist pattern may be first formed on the base substrate on which the oxide semiconductor material layer is formed. The third photoresist pattern includes a third photoresist area, a fourth photoresist area, a fifth photoresist area and a sixth photoresist area. The third photoresist area and the fourth photoresist area are spaced apart. The fourth photoresist area, the fifth photoresist area and the sixth photoresist area are connected in sequence. The third photoresist area, the fourth photoresist area and the sixth photoresist area have the same thickness, and the third photoresist is thinner than the fifth photoresist area. Then, the oxide semiconductor pattern may be obtained by removing a part of the oxide semiconductor material layer not covered with the third photoresist pattern. The photoresists in the third photoresist area, the fourth photoresist area and the sixth photoresist area are removed, and the photoresist in the fifth photoresist area is thinned to obtain a fourth photoresist pattern. The first gate and the second active layer is obtained by reducing a part of the oxide semiconductor pattern not covered with the fourth photoresist pattern. The second active layer includes a second source region and a second drain region that are subjected to the reduction treatment, and a second channel region not subjected to the reduction treatment. The second source region, the second channel region and the second drain region are sequentially arranged along a direction parallel to the base substrate. Finally, the fourth photoresist pattern is removed.

Continue to refer to FIG. 2, the first transistor 012 may further include a first gate insulating layer 0124, a first source and drain insulating layer 0125 and a first source and drain (including a first source 0126 and a first drain 0127). The second transistor 013 further includes a second gate insulating layer 0134, a second source-drain insulating layer 0135 and a second source and drain (including a second source 0136 and a second drain 0137). The first transistor 012 and the second transistor 013 meet at least one of the following conditions: the first source and drain and the second source and drain are disposed in the same layer; the first gate insulating layer 0124 and the second gate insulating layer 0134 are disposed in the same layer; and the source and drain insulating layer 0125 and the second source and drain insulating layer 0135 are disposed in the same layer. The present embodiment takes that the first source and drain and the second source and drain are disposed in the same layer, the first gate insulating layer 0124 and the second gate insulating layer 0134 are disposed in the same layer, and the first source and drain insulating layer 0125 and the second source and drain insulating layers 0135 are disposed in the same layer as an example.

The first gate insulating layer 0124 is disposed between the first gate 0122 and the first active layer 0121, and the second gate insulating layer 0134 is disposed between the second gate 0132 and the second active layer 0131. The first source and drain insulating layer 0125 is disposed between the first active layer 0121 and the first source and drain, and the second source and drain insulating layer 0135 is disposed between the second active layer 0131 and the second source and drain. The first source 0126 is electrically connected to the first source region 01211 by vias in the first gate insulating layer 0124 and the first source and drain insulating layer 0125. The first drain 0127 is electrically connected to the first drain region 01212 by the vias in the first gate insulating layer 0124 and the source and drain insulating layer 0125. The second source and drain may include a second source 0136 and a second drain 0137. The second source 0136 is electrically connected to the second source region 01311 by a via in the second source and drain insulating layer 0135. The second drain 0137 is electrically connected to the second drain region 01313 by the via in the second source-drain insulating layer 0135.

Optionally, a material of a part of the second gate insulating layer 0134 distal from the base substrate 011 includes a first oxide. A material of a part of the second source and drain insulating layer 0135 proximal to the base substrate 011 includes a second oxide. The first oxide and the second oxide may be the same or different, which is not limited in the embodiments of the present disclosure. Exemplarily, the present embodiment takes that the first oxide and the second oxide are the same, and materials of both the first oxide and the second oxide are silicon dioxide as an example. Optionally, the first oxide and the second oxide may also be other materials, e.g., silicon oxynitride.

In the present embodiment, the material of the part of the second gate insulating layer 0134 distal from the base substrate 011 includes an oxide, and the material of the part of the second source and drain insulating layer 0135 proximal to the base substrate 011 includes an oxide. That is, a material of a part of the second gate insulating layer 0134 proximal to the second active layer 0131 includes an oxide, and a material of a part of the second source and drain insulating layer 0135 proximal to the second active layer 0131 includes an oxide. When the material of the second active layer includes an oxide semiconductor, the second active layer is less likely to be reduced under the action of the oxides in the second gate insulating layer and the second source and drain insulating layer. Therefore, the characteristics of the second active layer can be ensured, and the service life of transistor device is improved.

Optionally, the material of the part of the second gate insulating layer 0134 proximal to the base substrate 011 includes a first non-oxide, and the material of the part of the second source and drain insulating layer 0135 distal from the base substrate 011 includes a second non-oxide. That is, a material of a part of the second gate insulating layer 0134 distal from the second active layer includes a non-oxide, and a material of a part of the second source and drain insulating layer 0135 distal from the second active layer includes a non-oxide. Materials of the first non-oxide and the second non-oxide may be the same or different, which is not limited in the embodiments of the present disclosure. Exemplarily, the present embodiment takes that the first non-oxide and the second non-oxide are the same and all are silicon nitride as an example. Since an insulation of a non-oxide is higher than an insulation of an oxide, adding the first non-oxide to the second gate insulating layer and the second non-oxide to the second source and drain insulating layer is beneficial to improve the insulation of the second gate insulating layer and the second source and drain insulating layer, so as to ensure normal operation of the transistor device.

Optionally, there is a transitional insulating layer between the first oxide and the first non-oxide. A material of the transitional insulating layer may be an insulating material such as silicon oxynitride or silicon nitride. In this way, the insulation of the first gate insulating layer may be further improved.

Optionally, the material of the first gate insulating layer 0124 is the same as the material of the second gate insulating layer 0134, and the material of the first source and drain insulating layer 0125 is the same as the material of the second source and drain insulating layer 0135. Since the first gate insulating layer and the second gate insulating layer are disposed in the same layer and made from the same material, during formation of the first gate insulating layer and the second gate insulating layer, a first insulating material layer may be formed on the base substrate first, and then, some vias are formed in the first insulating material layer to obtain the first gate insulating layer and the second gate insulating layer simultaneously. Since the first source and drain insulating layer and the second source and drain insulating layer are disposed in the same layer and made from the same material, during formation of the first source and drain insulating layer and the second source and drain insulating layer, a second insulating material layer may be formed on the base substrate first, and then some vias are formed in the second insulating material layer to obtain the first source and drain insulating layer and the second source and drain insulating layer simultaneously. The first source and drain and the second source and drain are also disposed in the same layer, and the first source and drain and the second source and drain may also be formed simultaneously in the case that the material of the first source and drain and the material of second source and drain are the same.

In addition, the transistor device in FIG. 2 may further include a covering layer 017. Both of the first transistor 012 and the second transistor 013 are disposed between the base substrate 011 and the covering layer 017. Orthographic projections of the first transistor 012 and the second transistor 013 on the base substrate 011 fall within an orthographic projection of the covering layer 017 on the base substrate 011. A material of the covering layer 017 may be an inorganic material or an organic material. The material of the covering layer 017 may be a silicon nitride layer, a silicon dioxide layer or a composite layer of the silicon nitride layer and the silicon dioxide layer in the case that the material of the covering layer 017 is an inorganic.

The transistor device provided by the present embodiment includes a first transistor and a second transistor, and the present embodiment takes that the transistor device includes one first transistor and one second transistor as an example. Optionally, the number of the first transistors in the transistor device may be any value greater than or equal to 1 (e.g., 2, 3, or 4), and the number of the second transistors may also be any value greater than or equal to 1 (e.g., 2, 3, or 4), which is not limited in the embodiments of the present disclosure.

In summary, in the transistor device provided by the present embodiment, the active layer of the first transistor and the gate of the second transistor are disposed in the same layer. However, gates and active layers of a plurality of transistors in a transistor device provided by the related art are disposed in different layers. It thus can be seen that the structure of the transistor device provided by the present embodiment is different from a structure of the transistor device in the related art. Therefore, the transistor device provided by the present embodiment is of a brand-new structure.

Moreover, when the first active layer and the second gate are disposed in the same layer, the first active layer of the first transistor and the second gate of the second transistor may be prepared in one patterning process instead of multiple patterning processes. When the first gate and the second active layer are disposed in the same layer, the first gate of the first transistor and the second active layer of the second transistor may be prepared by only one patterning process instead of multiple patterning processes. However, in traditional technologies, the first active layer of the first transistor and the second gate of the second transistor are disposed in different layers and need to be manufactured in multiple patterning processes; and the first gate of the first transistor and the second active layer of the second transistor are also disposed in different layers and need to be manufactured in multiple patterning processes. It thus can be seen that compared with the traditional technologies, the transistor device provided by the present embodiment is simple in manufacturing process, and the production efficiency is improved.

In addition, a total thickness of the first transistor and the second transistor in the transistor device provided by the present embodiment may be equal to a thickness of a single transistor (the first transistor or the second transistor). In addition, the number of times of the patterning processes required for manufacturing the two transistors may be equal to that required for manufacturing a single transistor. Compared with the traditional technologies, the present embodiment has the advantage that the manufacturing process of the transistor device is greatly simplified, and is applicable to mass production of the transistor device.

FIG. 3 is a flow diagram of a method for manufacturing a transistor device according to an embodiment of the present disclosure. The method may be used for manufacturing a transistor device (the transistor device shown in FIG. 1 or FIG. 2) provided by an embodiment of the present disclosure. As shown in FIG. 3, the method includes the following steps.

In step 301, a first transistor and a second transistor are formed on a base substrate.

The first transistor includes a first active layer, the second transistor includes a second gate. The first active layer and the second gate are disposed in the same layer.

In summary, in the transistor device manufactured by the method provided by the present embodiment, the active layer of the first transistor and the gate of the second transistor are disposed in the same layer. However, gates and active layers of a plurality of transistors in a transistor device provided by the related art are disposed in different layers. It thus can be seen that the structure of the transistor device provided by the present embodiment is different from a structure of the transistor device in the related art. Therefore, the transistor device provided by the present embodiment is of a brand-new structure.

FIG. 4 is a flow diagram of another method for manufacturing a transistor device according to an embodiment of the present disclosure. As shown in FIG. 4, the method includes the following steps.

In step 401, a polysilicon material layer and a conductor material layer are sequentially formed on a base substrate.

In step 401, an amorphous silicon material layer may be formed on the base substrate first and then processed to obtain the polysilicon material layer, and after that, the conductor material layer is formed on the polysilicon material layer.

During formation of the amorphous silicon material layer on the base substrate, a layer of amorphous silicon material may be formed on the base substrate by coating, Physical Vapor Deposition (PVD) or Chemical Vapor Deposition (CVD) to obtain the amorphous silicon material layer. PVD includes physical deposition methods such as magnetron sputtering or thermal evaporation, and CVD includes chemical deposition methods such as Plasma Enhanced Chemical Vapor Deposition (PECVD).

Figure 5:
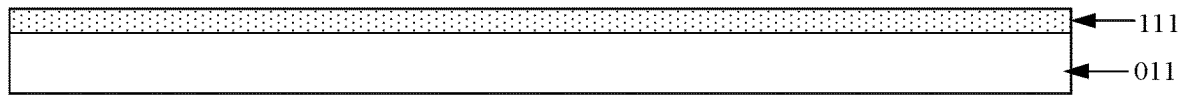
FIG. 5 is a schematic diagram showing a manufacturing process of a transistor device according to an embodiment of the present disclosure.

During processing of the amorphous silicon material layer into the polysilicon material layer, the amorphous silicon material layer may be processed into the polysilicon material layer by laser (or other methods, such as annealing). A structure obtained at this time may be the polysilicon material layer 111 on the base substrate 011, as shown in FIG. 5.

Figure 6:
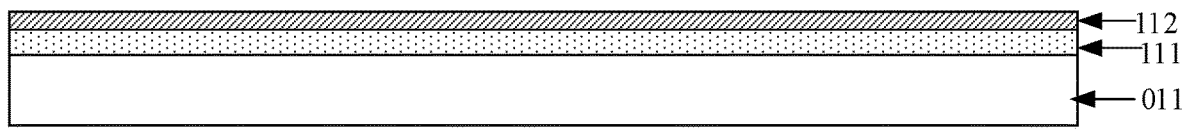
FIG. 6 is a schematic diagram showing a manufacturing process of a transistor device according to an embodiment of the present disclosure.

For the process of forming the conductor material layer on the polysilicon material layer, a reference may be made to the process of forming a monocrystalline silicon material layer, which is not repeated in the embodiments of the present disclosure. The structure obtained at this time may be the conductor material layer 112 on the base substrate 011, as shown in FIG. 6. Exemplarily, during formation of the conductor material layer in the present embodiment, magnetron sputtering may be adopted.

Optionally, the above-mentioned base substrate may be a glass substrate or other substrates, such as, a polyimide substrate, which is not limited in the embodiments of the present disclosure. A material of the conductor material layer may include a metal or graphene. In the case that the material of the conductor material layer includes a metal, the material of the conductor material layer may include one metal (e.g., silver, aluminum, copper, and molybdenum) or a multi-metal laminate material (e.g., at least one of aluminum or molybdenum, at least one of copper or molybdenum, or the like).

In step 402, a first photoresist pattern is formed on the base substrate on which the polysilicon material layer and the conductor material layer are formed.

After formation of the polysilicon material layer and the conductor material layer, the base substrate on which the polysilicon material layer and the conductor material layer are formed may be first coated with a photoresist layer. Afterwards, a halftone mask is adopted to expose the photoresist layer, and then developing the photoresist layer to obtain the first photoresist pattern.

Figure 7:
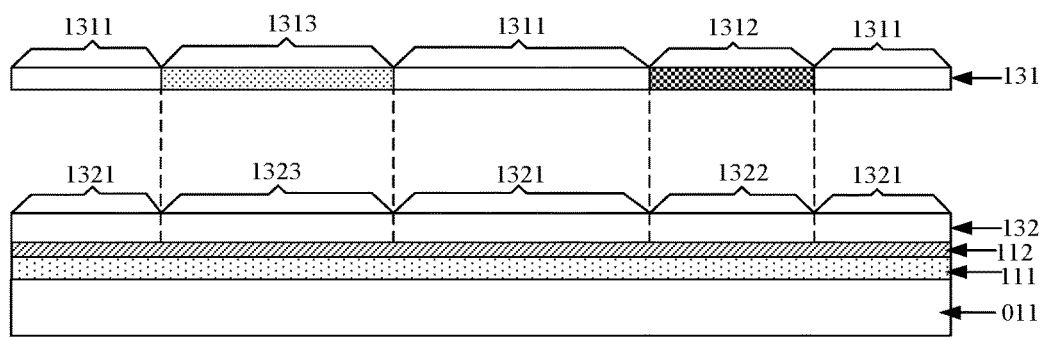
FIG. 7 is a schematic diagram showing a manufacturing process of a transistor device according to an embodiment of the present disclosure.

As shown in FIG. 7, the halftone mask 131 used in step 402 is provided with an all-transparent area 1311, a non-transparent area 1312 and a semi-transparent area 1313. The light transmittance of the all-transparent area 1311 is 100%, the light transmittance of the semi-transparent area 1313 is greater than 0 and less than 100%, and the light transmittance of the non-transparent area 1312 is 0. Before exposing, by the halftone mask 131, the photoresist layer 132 formed on the base substrate 011, the halftone mask 131 may be placed on a side of the photoresist layer 132 distal from the base substrate 011. At this time, the photoresist layer 132 includes a first area 1321, a second area 1322 and a third area 1323. An orthographic projection of the first area 1321 on the base substrate 011 coincides with an orthographic projection of the all-transparent area 1311 on the base substrate 011, an orthographic projection of the second area 1322 on the base substrate 011 coincides with an orthographic projection of the non-transparent area 1312 on the base substrate 011, and an orthographic projection of the third area 1323 on the base substrate 011 coincides with an orthographic projection of the semi-transparent area 1313 on the base substrate 011.

During exposure of the photoresist layer 132 by the halftone mask 131, the photoresist layer 132 may be exposed by the halftone mask 131 from a side of the halftone mask 131 distal from the base substrate 011 to denature the exposed part of the photoresist layer 132. It should be noted that the photoresist in the photoresist layer 132 may be a positive photoresist or a negative photoresist. When the photoresist in the photoresist layer 132 is a positive photoresist, the denatured part of the photoresist layer 132 is soluble in a developing liquid during development and removed, and the undenatured part of the photoresist layer 132 is insoluble in the developing liquid during development and retained. When the photoresist in the photoresist layer 132 is a negative photoresist, the denatured part of the photoresist layer 132 is insoluble in the developing liquid during development and retained, and the undenatured part of the photoresist layer 132 is soluble in the developing liquid during development and removed.

The present embodiment takes that the photoresist in the photoresist layer 132 is a positive photoresist as an example. In a first aspect, since the light transmittance of the all-transparent area 1311 in the halftone mask 131 in FIG. 7 is 100%, the photoresist in the first area 1321 (not shown in the figure) of the photoresist layer 132 in FIG. 7 is wholly denatured and is wholly removed after development to form a hollowed-out area (not shown in FIG. 8) in the first photoresist pattern 121 in FIG. 8. In a second aspect, since the light transmittance of the non-transparent area 1312 in FIG. 7 is 0, the second area 1322 in the photoresist layer 132 in FIG. 7 is wholly undenatured and is wholly retained after development to form a second photoresist area 1212 in the first photoresist pattern 121. In a third aspect, since the light transmittance of the semi-transparent area 1313 in FIG. 7 is greater than 0 and less than 100%, the photoresist in the third area 1323 of the photoresist layer 132 in FIG. 7 is partially undenatured and is merely partially retained after development to form a first photoresist area 1211 in FIG. 8. In addition, since the photoresist in the second area of the photoresist layer is wholly retained and the photoresist in the third area is partially retained, in FIG. 8, a thickness A2 of the second photoresist area 1212 is greater than a thickness A1 of the first photoresist area 1211.

Figure 8:
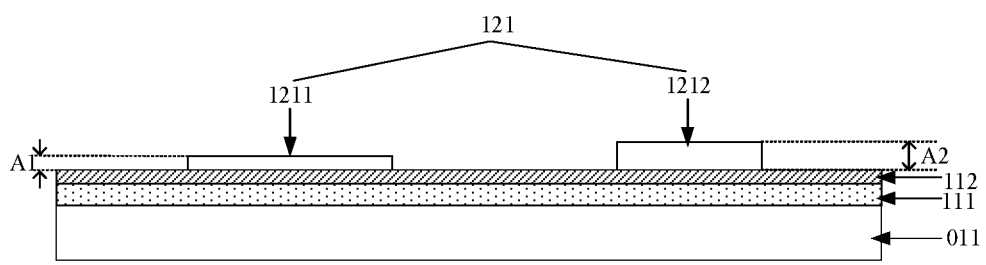
FIG. 8 is a schematic diagram showing a manufacturing process of a transistor device according to an embodiment of the present disclosure.

Certainly, when the photoresist in the photoresist layer is a negative photoresist, the all-transparent area and the non-transparent area in the halftone mask may be exchanged, such that the first photoresist pattern 121 shown in FIG. 8 may be obtained after exposing and developing the photoresist layer.

In step 403, a conductor pattern is obtained by removing a part of the conductor material layer not covered with the first photoresist pattern.

Figure 9:
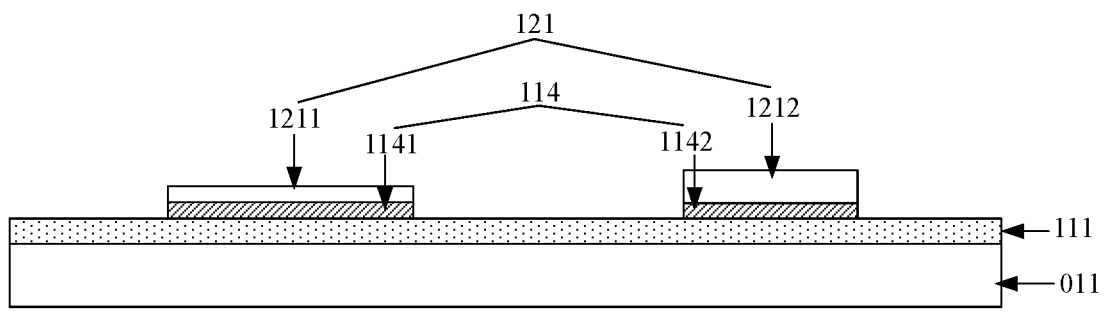
FIG. 9 is a schematic diagram showing a manufacturing process of a transistor device according to an embodiment of the present disclosure.

The first photoresist pattern obtained in step 402 only covers part of the conductor material layer. In this way, in step 403, the conductor material layer may be etched by taking the first photoresist pattern as an anti-etching layer to remove the part of the conductor material layer not covered with the first photoresist pattern, so as to obtain a conductor pattern 114 shown in FIG. 9. The conductor pattern 114 may include an auxiliary conductor block 1141 and a target conductor block 1142 that are spaced apart. An orthographic projection of the auxiliary conductor block 1141 on the base substrate 011 coincides with an orthographic projection of the first photoresist area 1211 on the base substrate 011, and an orthographic projection of the target conductor block 1142 on the base substrate 011 coincides with an orthographic projection of the second photoresist area 1212 on the base substrate 011.

In the embodiments of the present disclosure, the conductor material layer may be etched by dry etching or wet etching. The present embodiment takes that the conductor material layer is etched by wet etching as an example.

In step 404, a polysilicon pattern is obtained by removing a part of the polysilicon material layer not covered with the first photoresist pattern. The polysilicon pattern includes a polysilicon block and an auxiliary polysilicon block that are spaced apart.

Figure 10:
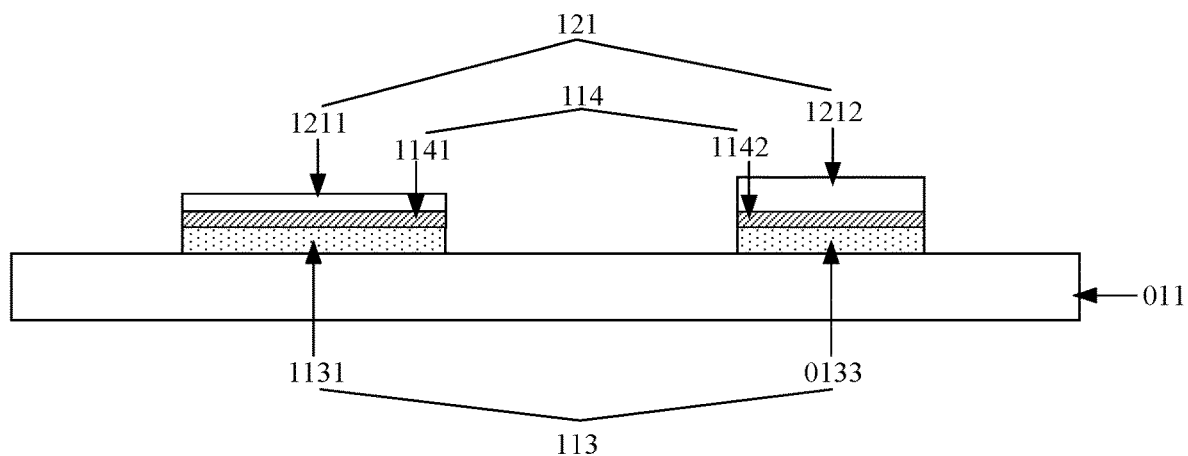
FIG. 10 is a schematic diagram showing a manufacturing process of a transistor device according to an embodiment of the present disclosure.

The first photoresist pattern obtained in step 402 only covers part of the polysilicon material layer. In this way, in step 404, the polysilicon material layer may be etched by taking the first photoresist pattern as an anti-etching layer to remove the part of the polysilicon material layer not covered with the first photoresist pattern, so as to obtain a polysilicon pattern 113 shown in FIG. 10. The polysilicon pattern 113 may include an auxiliary polysilicon block 1131 and a polysilicon block 0133 that are spaced apart. An orthographic projection of the auxiliary polysilicon block 1131 on the base substrate 011 coincides with an orthographic projection of the first photoresist area 1211 on the base substrate 011, and an orthographic projection of the polysilicon block 0133 on the base substrate 011 coincides with an orthographic projection of the second photoresist area 1212 on the base substrate 011.

In the embodiments of the present disclosure, the polysilicon material layer may be etched by dry etching or wet etching. The present embodiment takes that the polysilicon material layer is etched by dry etching as an example.

In step 405, a second photoresist pattern is obtained by removing the photoresist in the first photoresist area and thinning the photoresist in the second photoresist area.

Figure 11:
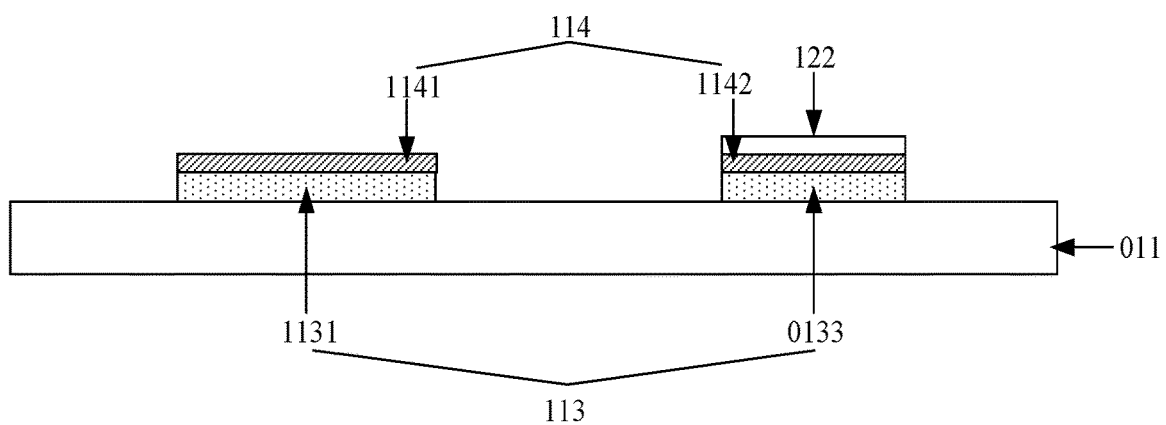
FIG. 11 is a schematic diagram showing a manufacturing process of a transistor device according to an embodiment of the present disclosure.

It can be seen from step 402 that the first photoresist area pattern is thinner than the second photoresist area in the first photoresist pattern. In step 405, the entire first photoresist pattern may be ashed to remove the photoresist in the first photoresist area, and the photoresist in the second photoresist area may be thinned to obtain a second photoresist pattern 122 as shown in FIG. 11.

The first photoresist pattern covers both of the conductor pattern and the polysilicon pattern. The second photoresist pattern 122 only includes the photoresist obtained by thinning the photoresist in the second photoresist area of the first photoresist pattern. Therefore, the second photoresist pattern 122 only covers the target conductor block 1142 in the conductor pattern and the polysilicon block 0133 in the polysilicon pattern but does not cover the auxiliary conductor block 1141 in the conductor pattern or the auxiliary polysilicon block 1131 in the polysilicon pattern.

In step 406, a gate body is obtained by removing a part of the conductor pattern not covered with the second photoresist pattern. A second gate includes the gate body and the polysilicon block.

Figure 12:
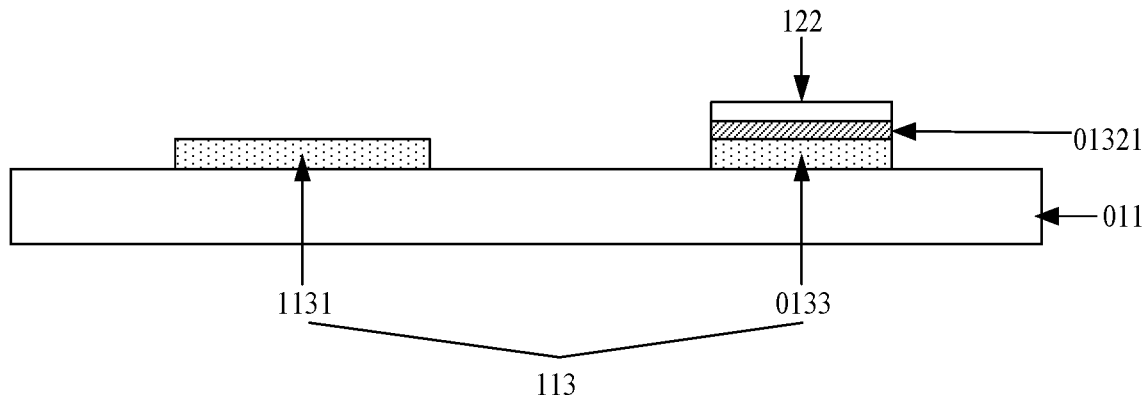
FIG. 12 is a schematic diagram showing a manufacturing process of a transistor device according to an embodiment of the present disclosure.

The second photoresist pattern formed in step 405 only covers the target conductor block 1142 in the conductor pattern 114 but does not cover the auxiliary conductor block 1141 in the conductor pattern. Therefore, in step 406, the conductor pattern 114 in FIG. 11 may be etched by taking the second photoresist pattern 122 as an anti-etching layer to remove the auxiliary conductor block 1141 of the conductor pattern 114 not covered with the second photoresist pattern 122, so as to obtain a gate body 01321 shown in FIG. 12. The gate body 01321 is also the target conductor block 1142 in FIG. 11. A second gate includes the gate body 01321 and the polysilicon block 0133.

In the embodiments of the present disclosure, the conductor pattern may be etched by dry etching or wet etching. The present embodiment takes that the conductor pattern is etched by wet etching as an example.

In step 407, the second photoresist pattern is removed.

Figure 13:
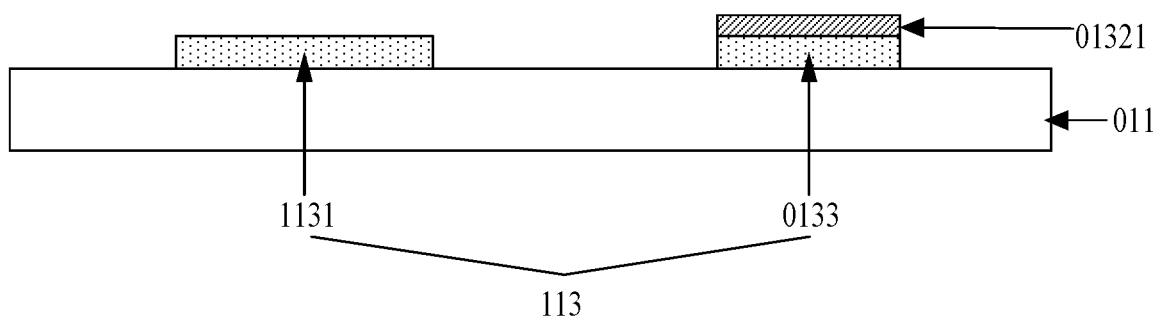
FIG. 13 is a schematic diagram showing a manufacturing process of a transistor device according to an embodiment of the present disclosure.

After the auxiliary polysilicon block is obtained, a structure shown in FIG. 13 is obtained by removing the second photoresist pattern by stripping. At this time, only the polysilicon pattern 113 and the gate body 01321 are provided on the base substrate 011.

Optionally, the second photoresist pattern may also be removed by other means, such as ashing or removal with a developing liquid.

In step 408, a first insulating material layer is formed on the base substrate on which the polysilicon pattern and the gate body are formed.

After step 407, the polysilicon pattern and the gate body are formed on the base substrate and are partially overlapping. A structure shown in FIG. 14 may be obtained after the first insulating material layer is formed on the base substrate on which the polysilicon pattern and the gate body are formed.

Figure 14:
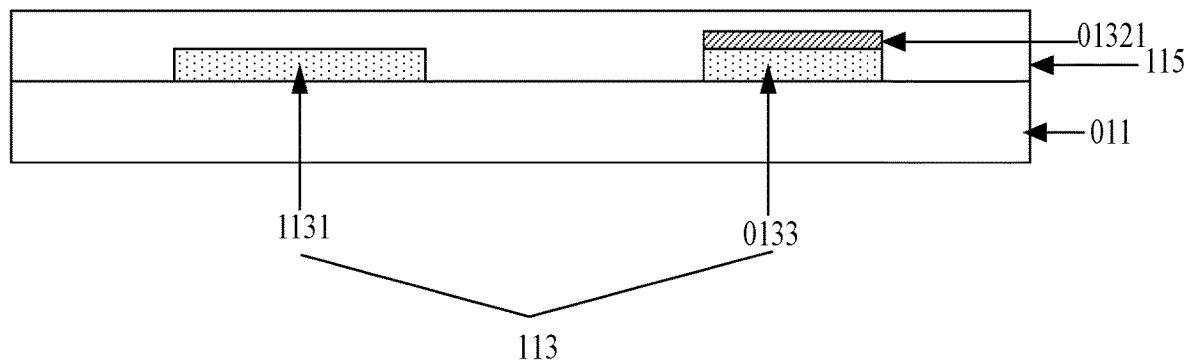
FIG. 14 is a schematic diagram showing a manufacturing process of a transistor device according to an embodiment of the present disclosure.

A material of the part of the first insulating material layer 115 distal from the base substrate 011 in FIG. 14 includes a first oxide, and a material of the part of the first insulating material layer 115 proximal to the base substrate 011 includes a first non-oxide. In this way, the first insulating material layer 115 formed after step 408 is of a layered structure. Optionally, the first non-oxide may be silicon nitride, and the first oxide may be silicon dioxide, and silicon oxynitride may be used for transition between the first oxide and the first non-oxide, which is not limited in the embodiments of the present disclosure.

Exemplarily, during formation of the first insulating material layer in an embodiment of the present disclosure, a plasma vapor deposition method may be adopted, and the device used may be a plasma vapor deposition device. Optionally, deposition methods such as coating, magnetron sputtering or thermal evaporation may also be adopted.

In step 409, an oxide semiconductor material layer is formed on the base substrate on which the polysilicon pattern, the gate body and the first insulating material layer are formed.

Figure 15:
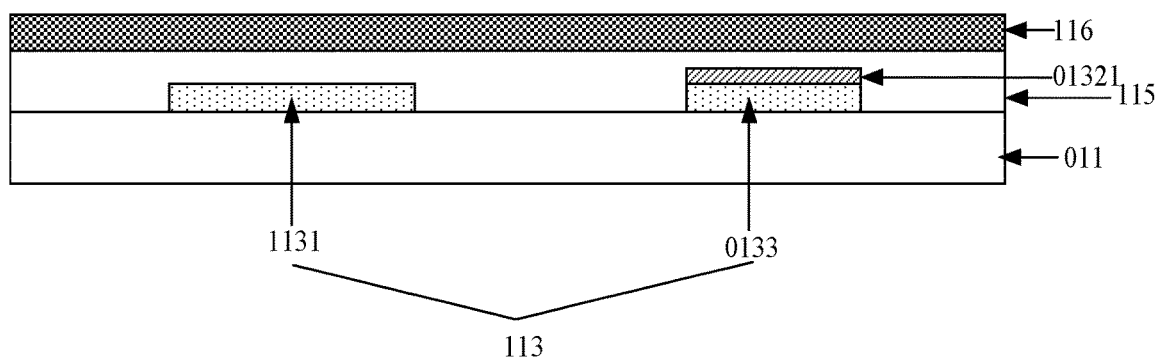
FIG. 15 is a schematic diagram showing a manufacturing process of a transistor device according to an embodiment of the present disclosure.

After formation of the first insulating material layer, it is necessary to form an oxide semiconductor material layer on the base substrate on which the polysilicon pattern, the gate body and the first insulating material layer are formed to obtain a structure shown in FIG. 15. Optionally, the oxide semiconductor material layer 116 may be an IGZO layer or other material layers.

Exemplarily, the method of forming the oxide semiconductor material layer 116 may be magnetron sputtering. Optionally, coating, thermal evaporation or ion-enhanced chemical vapor deposition may also be adopted.

In step 410, a third photoresist pattern is formed on the base substrate on which the oxide semiconductor material layer is formed.

Figure 16:
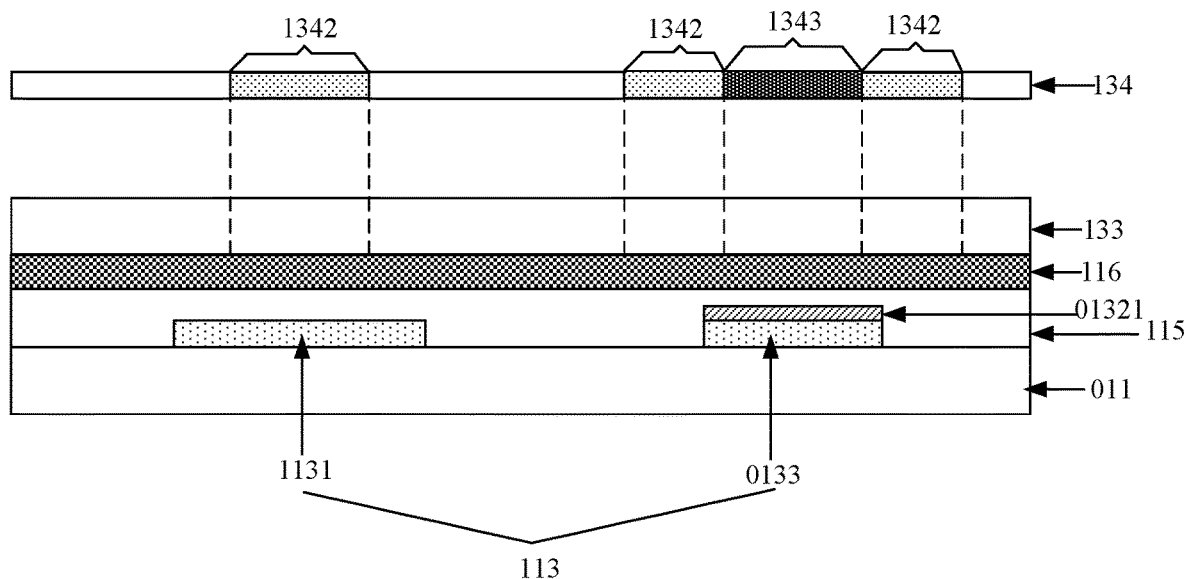
FIG. 16 is a schematic diagram showing a manufacturing process of a transistor device according to an embodiment of the present disclosure.

After formation of the oxide semiconductor material layer, it is necessary to form a third photoresist pattern on the base substrate on which the oxide semiconductor material layer is formed, and this process is shown in FIG. 16. During formation of the third photoresist pattern, the base substrate 011 on which the oxide semiconductor material layer 116 is formed is first coated with a photoresist layer 133, and then the photoresist layer 133 is exposed by a halftone mask 134. The halftone mask includes an all-transparent area (not marked in FIG. 16), a semi-transparent area 1342, and a non-transparent area 1343. The photoresist layer 133 is exposed by the halftone mask 134, such that the photoresist in an orthographic projection area of the all-transparent area on the photoresist layer 133 is wholly denatured, the photoresist in an orthographic projection area of the semi-transparent area 1342 on the photoresist layer 133 is partially denatured, and the photoresist in an orthographic projection area of the non-transparent area 1343 on the photoresist area 133 is partially denatured. Finally, the exposed photoresist layer 133 is processed by a developing liquid to remove the denatured photoresist, so as to obtain a third photoresist pattern 123 as shown in FIG. 17.

Figure 17:
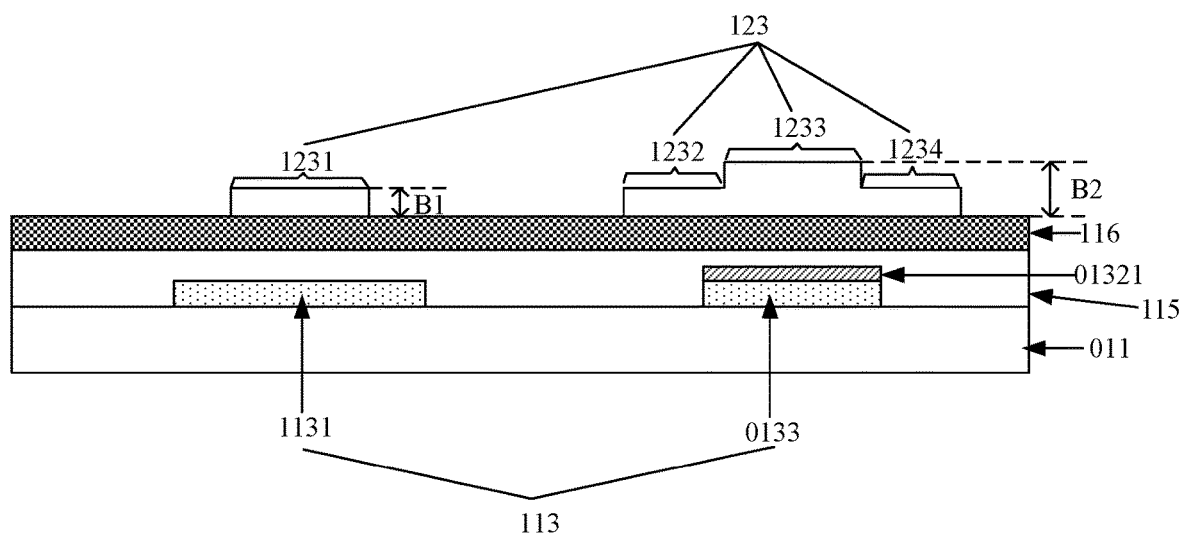
FIG. 17 is a schematic diagram showing a manufacturing process of a transistor device according to an embodiment of the present disclosure.

Referring to FIG. 17, the third photoresist pattern 123 includes a third photoresist area 1231, a fourth photoresist area 1232, a fifth photoresist area 1233 and a sixth photoresist area 1234. The third photoresist area 1231 and the fourth photoresist area 1232 are spaced apart, and the fourth photoresist area 1232, the fifth photoresist area 1233 and the sixth photoresist area 1234 are connected in sequence. The third photoresist area 1231, the fourth photoresist area 1232 and the sixth photoresist area 1234 have the same thickness, and the thickness B1 of the third photoresist area 1231 is less than the thickness B2 of the fifth photoresist area 1233.

In step 411, an oxide semiconductor pattern is obtained by removing the part of the oxide semiconductor material layer not covered with the third photoresist pattern.

Figure 18:
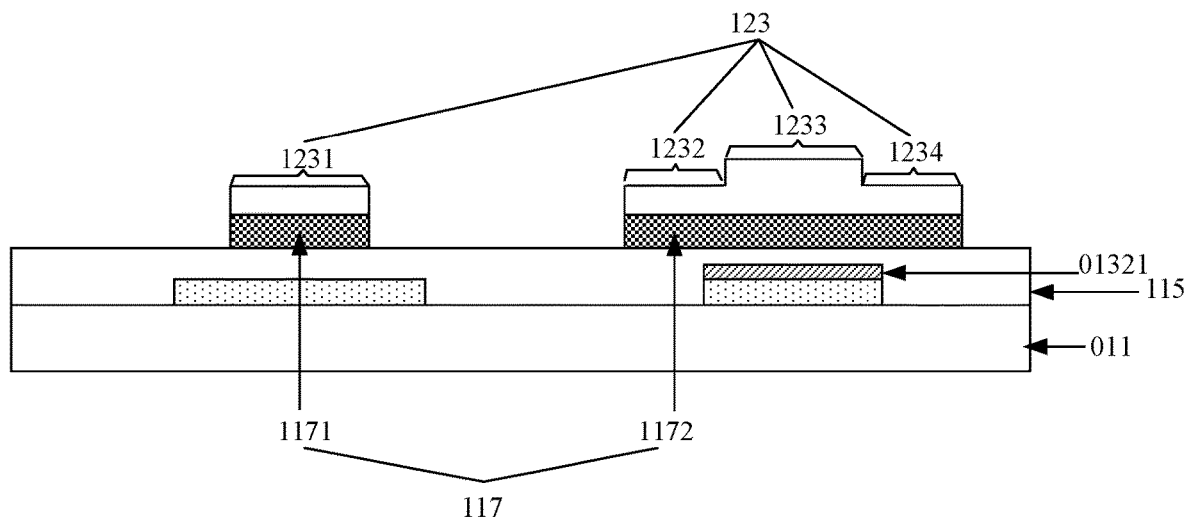
FIG. 18 is a schematic diagram showing a manufacturing process of a transistor device according to an embodiment of the present disclosure.

The third photoresist pattern obtained after step 410 only covers part of the oxide semiconductor material layer. In this way, a structure as shown in FIG. 18 is obtained by removing the part of the oxide semiconductor material layer not covered with the third photoresist pattern by taking the third photoresist pattern as an anti-etching layer. The oxide semiconductor pattern 117 includes an auxiliary oxide block 1171 and a target oxide block 1172 that are spaced apart. An orthographic projection of the auxiliary oxide block 1171 on the base substrate 011 coincides with an orthographic projection of the third photoresist area 1231 on the base substrate 011, and an orthographic projection of the target oxide block 1172 on the base substrate 011 coincides with orthographic projections of the fourth photoresist area 1232, the fifth photoresist area 1233 and the sixth photoresist area 1234 on the base substrate 011.

In step 412, a first active layer is obtained by doping the auxiliary polysilicon block in the polysilicon pattern by taking the third photoresist pattern as a mask.

Figure 19:
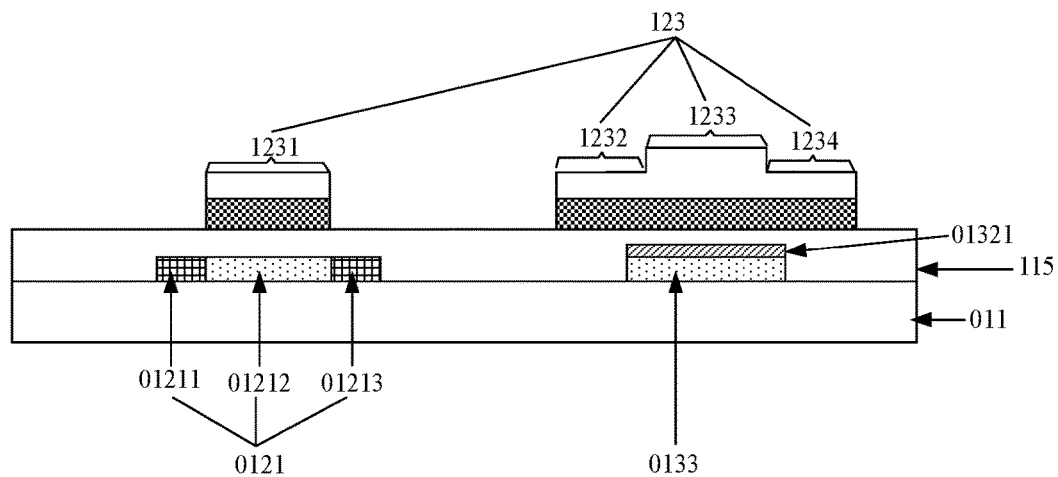
FIG. 19 is a schematic diagram showing a manufacturing process of a transistor device according to an embodiment of the present disclosure.

After the oxide semiconductor pattern is obtained, the auxiliary polysilicon block in the polysilicon pattern may be doped by taking the third photoresist pattern as a mask to obtain a first active layer 0121 as shown in FIG. 19. The first active layer 0121 includes a first channel region 01212, a first source region 01211 and a first drain region 01213, and the first source region 01211. The first channel region 01212 and the first drain region 01213 are sequentially connected. An orthographic projection of the first channel region 01212 on the base substrate 011 completely overlaps an orthographic projection of the auxiliary semiconductor block on the base substrate 011.

Exemplarily, ion implantation may be used for doping the polysilicon pattern, and implanted ions may be P-type ions (e.g., boron ions and arsenic ions) or N-type ions (e.g., phosphorus ions and gallium ions). In addition, the polysilicon pattern may also be doped by diffusion or the like, which is not limited in the embodiments of the present disclosure.

It should be noted that the step 412 may be performed after the step 411, or may be performed in any step after the step 404, which is not limited in the embodiments of the present disclosure. Moreover, in the process of obtaining the first active layer by doping the auxiliary polysilicon block in the polysilicon pattern, the third photoresist pattern may also not be used as a mask, which is not limited in the present embodiment.

In step 413, a fourth photoresist pattern is obtained by removing the photoresist in a third photoresist area, a fourth photoresist area and a sixth photoresist area and thinning the photoresist in a fifth photoresist area.

Figure 20:
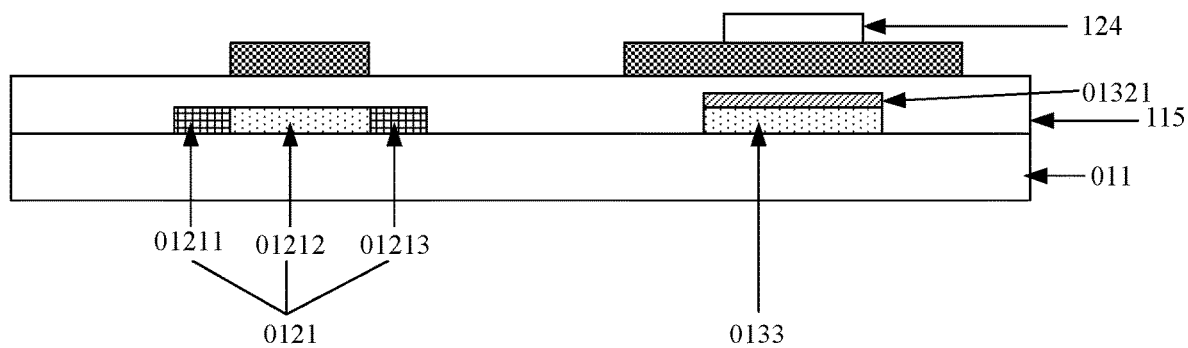
FIG. 20 is a schematic diagram showing a manufacturing process of a transistor device according to an embodiment of the present disclosure.

In step 413, the third photoresist pattern may be ashed by a plasma etching device to remove the third photoresist area, the fourth photoresist area and the sixth photoresist area of the third photoresist pattern and to thin the fifth photoresist area, to obtain a fourth photoresist pattern 124 as shown in FIG. 20. It can be seen from FIG. 20 that the fourth photoresist pattern 124 only covers the middle area of the target oxide block in the oxide semiconductor pattern but does not cover an edge area of the target oxide block or the auxiliary oxide block.

The plasma etching device may be a Reactive Ion Etching (RIE) device, or an Inductively Couple Plasma (ICP) device.

In step 414, an auxiliary pattern is obtained by reducing a part of the oxide semiconductor pattern not covered with the fourth photoresist pattern.

Figure 21:
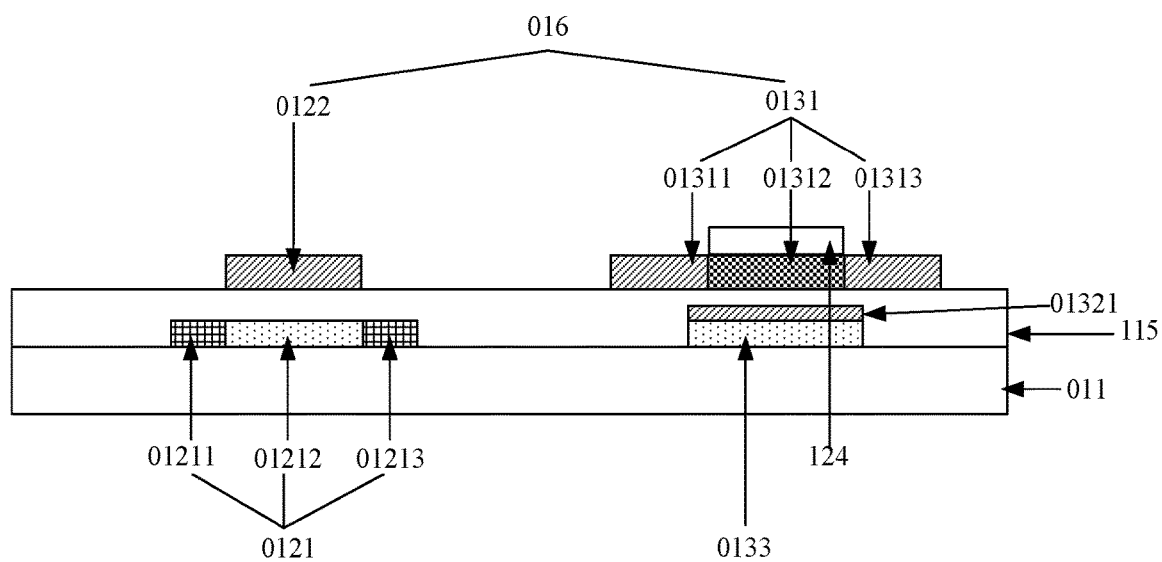
FIG. 21 is a schematic diagram showing a manufacturing process of a transistor device according to an embodiment of the present disclosure.

After the fourth photoresist pattern 124 is formed, an auxiliary pattern 016 shown in FIG. 21 is obtained by reducing the part of the oxide semiconductor pattern not covered with the fourth photoresist pattern 124. Exemplarily, a material containing a hydrogen element (e.g., hydrogen plasma) or other materials containing reductive elements (e.g., chlorine) is adopted for reducing.

In the oxide semiconductor pattern, a first gate 0122 in the auxiliary pattern 016 is obtained by reducing the auxiliary oxide block, and a second source region 01311 and a second drain region 01313 of a second active layer 0131 in the auxiliary pattern 016 is obtained by reducing the edge area of the target oxide block not covered with the fourth photoresist pattern. The first gate 0122 and the second active layer 0131 are spaced apart, an orthographic projection of the gate body 01321 on the base substrate 011 partially overlaps an orthographic projection of the second active layer 0131 on the base substrate 011, and an orthographic projection of the first gate 0122 on the base substrate 011 falls within an orthographic projection of the first active layer 0121 on the base substrate 011.

Exemplarily, a plasma device may be used to reduce the part of the oxide semiconductor pattern not covered with the fourth photoresist pattern. Optionally, a microwave plasma device, a vacuum plasma equipment or the like may be adopted.

In step 415, the fourth photoresist pattern is removed.

Figure 22:
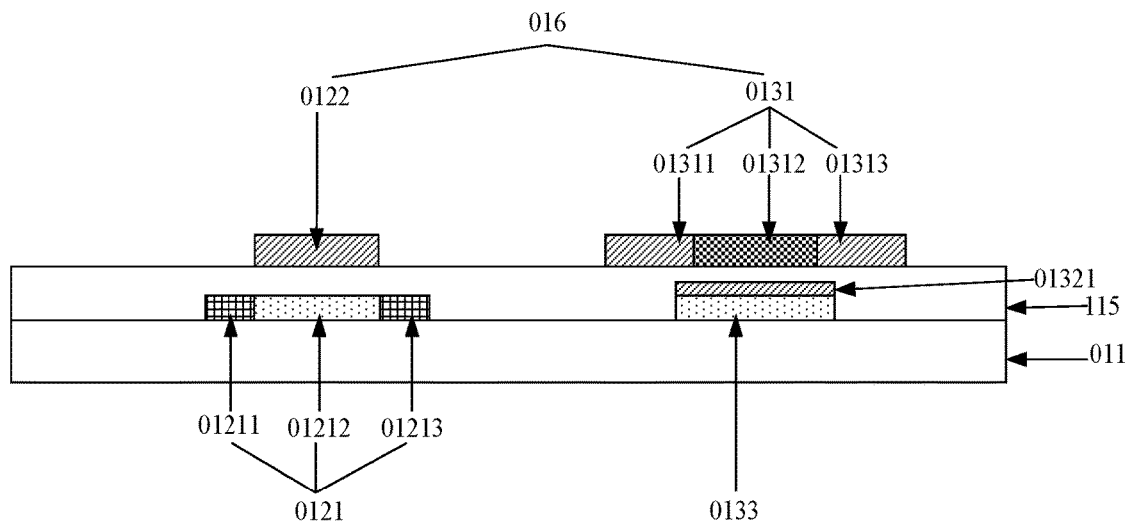
FIG. 22 is a schematic diagram showing a manufacturing process of a transistor device according to an embodiment of the present disclosure.

After the auxiliary pattern is obtained, a structure as shown in FIG. 22 is obtained by removing the fourth photoresist pattern by stripping. At this time, the second gate (including the polysilicon block 0133 and the gate body 01321), the first active layer 0121, the first insulating layer material layer 115, the first gate 0122, and the second active layer 0131 are provided on the base substrate.

In step 416, a second insulating material layer is formed on the base substrate on which the auxiliary pattern is formed.

Figure 23:
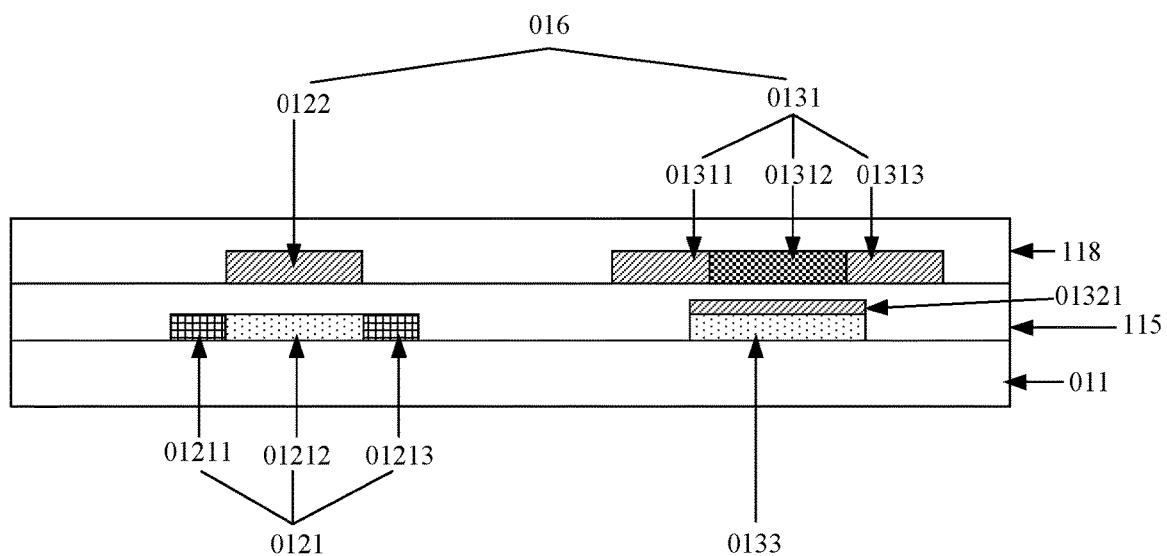
FIG. 23 is a schematic diagram showing a manufacturing process of a transistor device according to an embodiment of the present disclosure.

After removal of the fourth photoresist pattern, a second insulating material layer 118 as shown in FIG. 23 is formed on the base substrate on which the auxiliary pattern is formed. A material of a part of the second insulating material layer 118 proximal to the base substrate 011 includes a second oxide, and a material of a part of the second insulating material layer distal from the base substrate includes a second non-oxide.

In step 417, a source and drain insulating pattern is obtained by forming a first via and a second via in the second insulating material layer.

Figure 24:
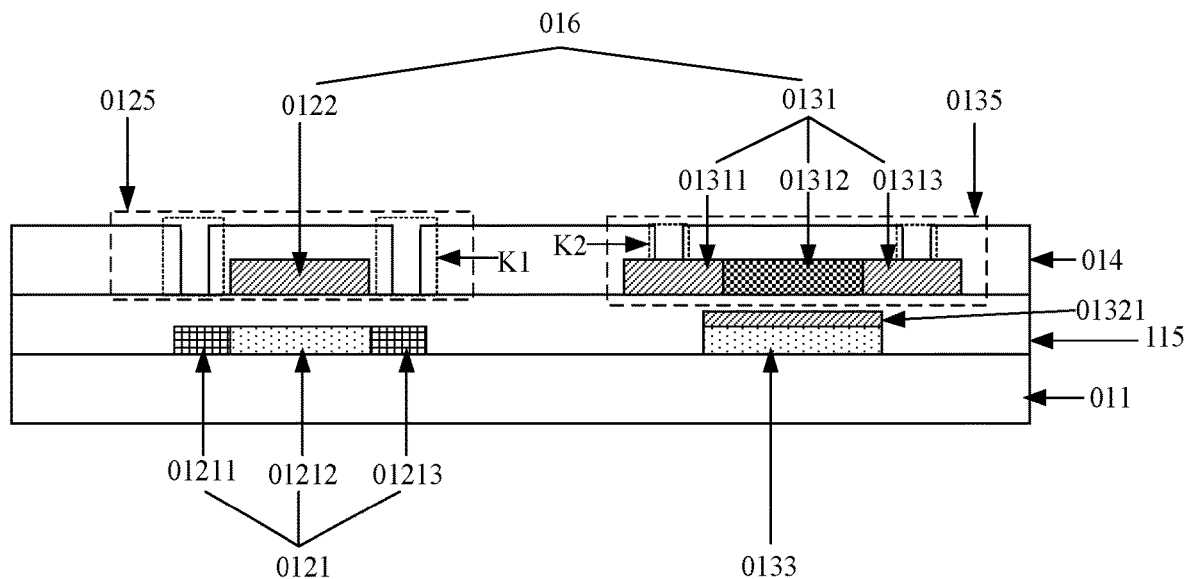
FIG. 24 is a schematic diagram showing a manufacturing process of a transistor device according to an embodiment of the present disclosure.

After formation of the second insulating material layer, a first via K1 and a second via K2 in FIG. 24 may be formed in the second insulating material layer to obtain a source and drain insulating pattern 014 shown in FIG. 24. As shown in FIG. 24, the source and drain insulating pattern 014 may include a first source and drain insulating layer 0125 and a second source and drain insulating layer 0135. The first via K1 is formed in the first source and drain insulating layer 0125, and the second via K2 is formed in the second source and drain insulating layer 0135.

In step 418, a gate insulating pattern is obtained by forming a third via in the first insulating material layer.

Figure 25:
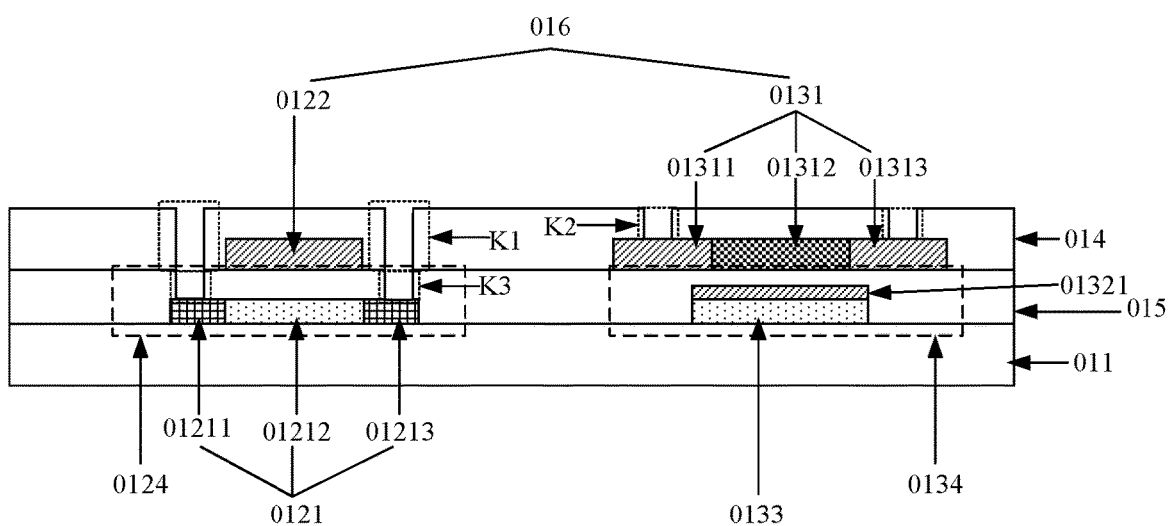
FIG. 25 is a schematic diagram showing a manufacturing process of a transistor device according to an embodiment of the present disclosure.

After the first via and the second via are obtained, it is necessary to form a third via in the first insulating material layer to obtain a gate insulating pattern. The method for forming the third via is the same as that for forming the second via. As shown in FIG. 25, the gate insulating pattern 015 includes a first gate insulating layer 0124 and a second gate insulating layer 0134, and the third via K3 is formed in the first gate insulating layer 0124 and communicated with the first via K1.

In step 419, a source and drain conductive pattern is formed on the base substrate on which the source and drain insulating pattern and the gate insulating pattern are formed.

After step 418, the first via and the third via that are in communication with each other, as well as the second via, are formed in the base substrate. Then, a conductive material layer is formed by a film-forming process based on step 418, and a source and drain material layer is processed in one patterning process to obtain a source and drain conductive pattern. The source and drain conductive pattern includes a first source and drain and a second source and drain.

Figure 26:
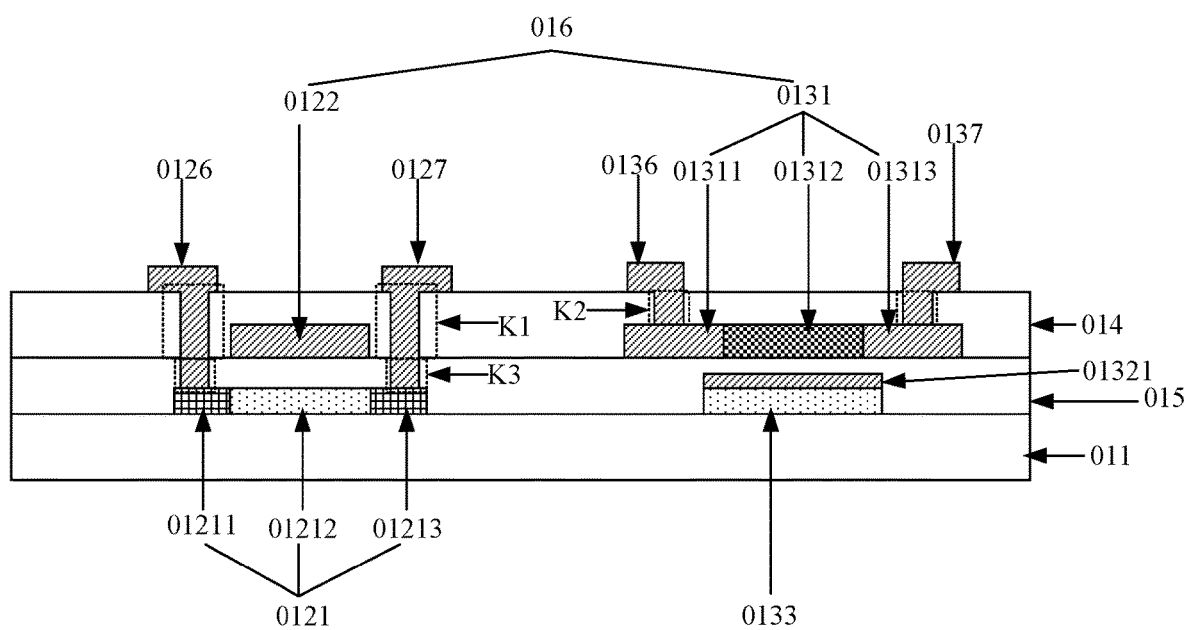
FIG. 26 is a schematic diagram showing a manufacturing process of a transistor device according to an embodiment of the present disclosure.

As shown in FIG. 26, the first source and drain includes a first source 0126 and a first drain 0127. The first source 0126 is electrically connected to a first source region 01211 by one first via and one third via. The first drain 0127 is electrically connected to a first drain region 01213 by another first via and another third via.

Continuing to refer to FIG. 26, the second source and drain includes a second source 0136 and a second drain 0137. The second source 0136 is electrically connected to a second source region 01311 by one second via K2. The second drain 0137 is electrically connected to a first drain region 01313 by another second via K2.

In step 420, a covering layer is formed on the base substrate on which the source and drain conductive pattern is formed.

Figure 27:
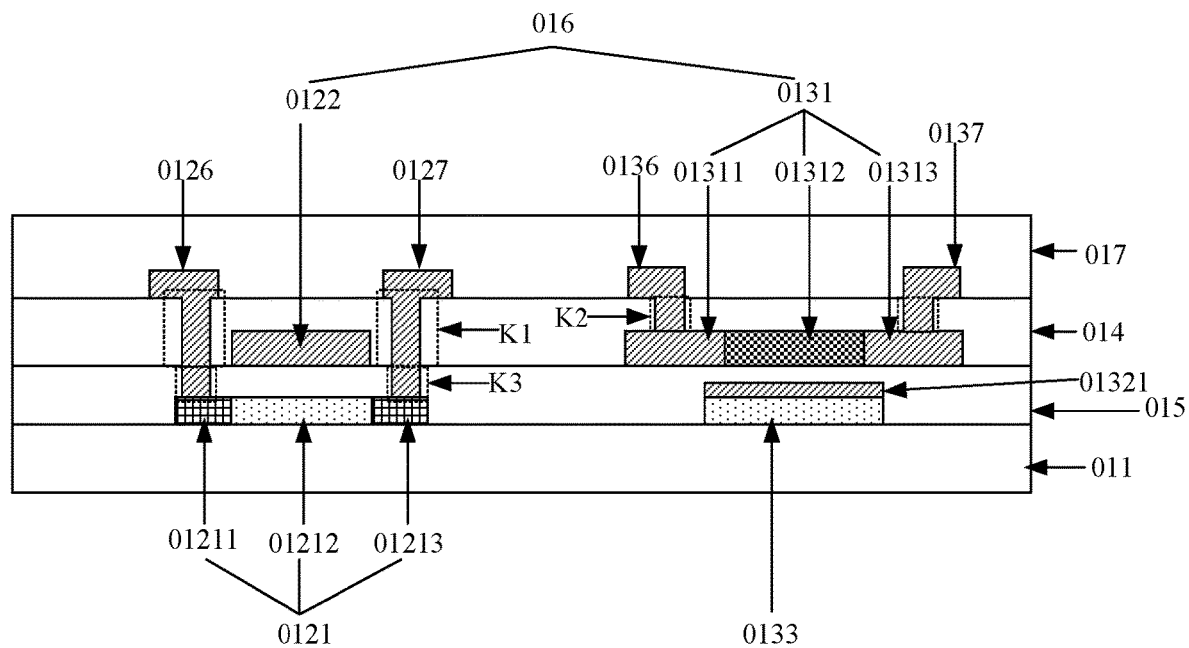
FIG. 27 is a schematic diagram showing a manufacturing process of a transistor device according to an embodiment of the present disclosure.

After formation of the source and drain conductive pattern, a covering layer 017 is formed on the base substrate on which the source and drain conductive pattern is formed to obtain a structure as shown in FIG. 27.

In the present embodiment, the first active layer and the second gate are manufactured in one patterning process, the second active layer and the first gate are manufactured in one patterning process, the first gate insulating layer and the second gate insulating layer are manufactured at the same time, the first source and drain insulating layer and the second source and drain insulating layer are manufactured at the same time, and the first source and drain and the second source and drain are manufactured at the same time. It thus can be seen that in the present embodiment, another transistor may be prepared while one transistor is prepared, and manufacturing technologies may not be increased due to increase in the number of transistors to be prepared. Moreover, the total thickness of the two transistors manufactured by the manufacturing method provided by the present embodiment is equivalent to the thickness of one transistor.

Figure 28:
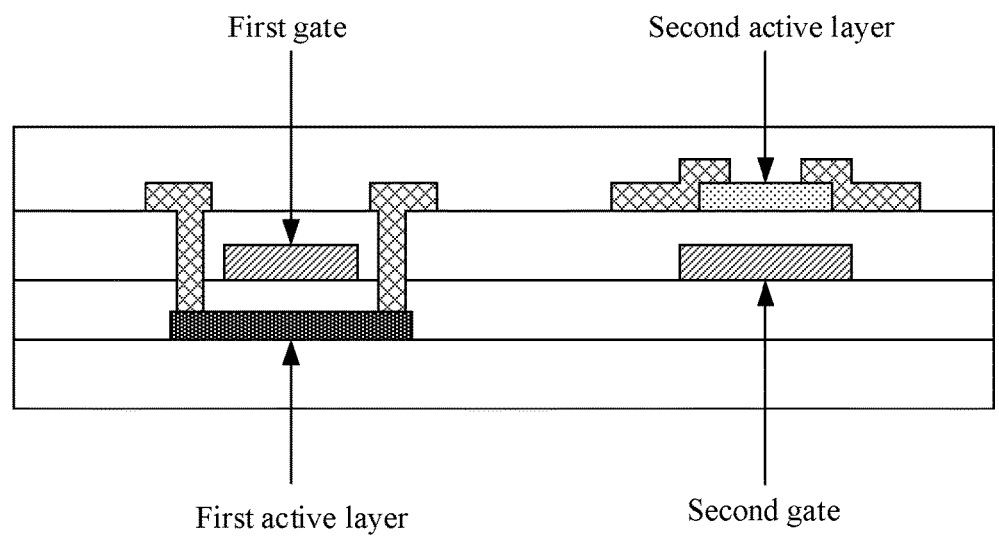
FIG. 28 is a schematic structural diagram of a transistor device according to the related art.

The transistor device manufactured in the related art may be as shown in FIG. 28. The first active layer and the second gate are disposed in different layers, and the first gate and the second active layer are disposed in different layers. Therefore, during manufacture of the transistor device, it is impossible that the first active layer and the second gate are manufactured at the same time, and the first gate and the second active layer are manufactured at the same time. More manufacturing technologies are required than that required by a single transistor. Meanwhile, the total thickness of the two transistors manufactured is greater than the thickness of one transistor.

In summary, in the transistor device manufactured by the method provided by the present embodiment, the active layer of the first transistor and the gate of the second transistor are disposed in the same layer. However, gates and active layers of a plurality of transistors in a transistor device provided by the related art are disposed in different layers. It thus can be seen that the structure of the transistor device provided by the present embodiment is different from a structure of the transistor device in the related art. Therefore, the transistor device provided by the present embodiment is of a brand-new structure.

An embodiment of the present disclosure provides a display substrate including the transistor device shown in FIG. 1 or FIG. 2. The display substrate may be a flexible substrate or a rigid substrate, which is not limited in the present embodiment.

Figure 29:
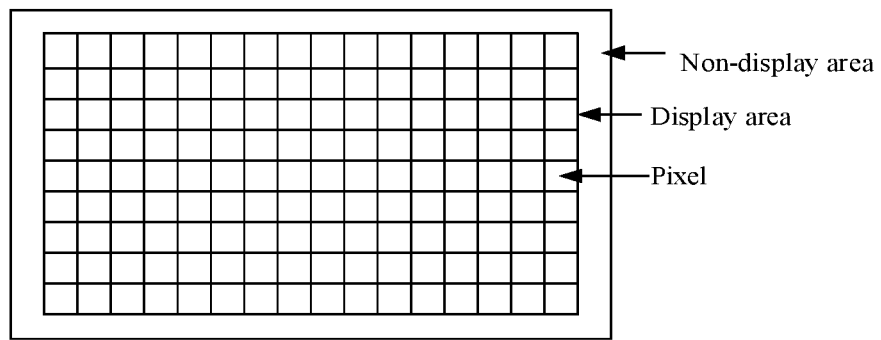
FIG. 29 is a top view of a display substrate according to an embodiment of the present disclosure.

Exemplarily, FIG. 29 is a top view of a display substrate according to an embodiment of the present disclosure. As shown in FIG. 29, the display substrate may include a display area and a non-display area. The display area includes a plurality of pixels arranged in an array. The transistor device provided by the embodiment of the present disclosure may be disposed in the non-display area and may also be disposed in the pixel (e.g., a drive circuit in the pixel), which is not limited in the present embodiment.

An embodiment of the present disclosure provides a display device including the display substrate provided by the embodiment of the present disclosure. The display device may be any product or component having a display function, such as a liquid crystal panel, an organic light-emitting diode (OLED) panel, a light-emitting diode (LED) panel, a quantum dot panel, electronic paper, a mobile phone, a tablet computer, a television, a display, a notebook computer, a digital photo frame, or a navigator.

It should be noted that in the accompanying drawings, for clarity of the illustration, the dimension of the layers and areas may be scaled up. It may be understood that when an element or layer is described as being "above" another element or layer, the described element or layer may be directly on the other element or layer, or at least one intermediate layer may be arranged between the described element or layer and the other element or layer. In addition, it may be understood that when an element or layer is described as being "below" another element or layer, the described element or layer may be directly below the other element or layer, or at least one intermediate layer may be arranged between the described element or layer and the other element or layer. In addition, it may be further understood that when a layer or element is described as being arranged "between" two layers or elements, the described layer or element may be the only layer between the two layers or elements, or at least one intermediate layer or element may be arranged between the described element or layer and the two layers or elements. In the whole description described above, like reference numerals denote like elements.

In the present disclosure, the terms "first" and "second" are used for descriptive purposes only and are not to be construed as indicating or implying relative importance. The term "plurality" refers to two or more, unless specifically defined otherwise.

It should be noted that the method embodiments and the corresponding transistor device embodiments provided by the present disclosure may make cross reference, which is not limited in the embodiments of the present disclosure. The sequence of the steps in the method embodiments may be adjusted appropriately, and the steps may be deleted or added according to the situation. Within the technical scope disclosed in the present disclosure, any variation of the method easily derived by those skilled in the art shall fall within the protection scope of the present disclosure, which is not repeated herein.

Described above are merely exemplary embodiments of the present disclosure, and are not intended to limit the present disclosure. Within the spirit and principles of the present disclosure, any modifications, equivalent substitutions, improvements, and the like, should be within the protection scope of the present disclosure.

What is claimed is:

1. A transistor device, comprising a base substrate, and a first transistor and a second transistor that are on the base substrate;
   wherein the first transistor comprises a first active layer, and the second transistor comprises a second gate, the first active layer and the second gate being in the same layer, the second transistor further comprises a second active layer, a material of the first active layer being different from a material of the second active layer, the material of the first active layer comprises polysilicon, and the material of the second active layer comprises an oxide semiconductor, the first active layer comprises a first source region, a first channel region, and a first drain region, and the second gate comprises a gate body and a polysilicon block, the first source region, the first channel region and the first drain region are sequentially arranged along a direction parallel to the base substrate; the polysilicon block and the gate body are sequentially arranged along a direction perpendicular to and away from the base substrate; an orthographic projection of the polysilicon block on the base substrate coincides with an orthographic projection of the gate body on the base substrate; and a material of the first channel region is the same as a material of polysilicon block.

2. The transistor device according to claim 1, wherein the first transistor further comprises a first source and drain, a first gate insulating layer and a first source and drain insulating layer, the second transistor further comprises a second source and drain, a second gate insulating layer and a second source and drain insulating layer, and the first transistor and the second transistor meet at least one of the following conditions:
   the first source and drain and the second source and drain are in the same layer;
   the first gate insulating layer and the second gate insulating layer are in the same layer; and
   the first source and drain insulating layer and the second source and drain insulating layer are in the same layer.

3. The transistor device according to claim 1, wherein the first transistor is of a top gate structure, and the second transistor is of a bottom gate structure.

4. The transistor device according to claim 1, wherein the first transistor further comprises a first gate, and the second transistor further comprises a second active layer, wherein the first gate and the second active layer are disposed in the same layer.

5. The transistor device according to claim 4, wherein the second active layer comprises a second source region, a second channel region and a second drain region;
   wherein the second source region, the second channel region and the second drain region are sequentially arranged along a direction parallel to the base substrate, and materials of the second source region and the second drain region are the same as a material of the first gate.

6. The transistor device according to claim 1, wherein the second transistor further comprises a second active layer, a second gate insulating layer and a second source and drain insulating layer; wherein
   a material of the second active layer comprises an oxide semiconductor, and the second gate insulating layer, the second active layer and the second source and drain insulating layer are sequentially arranged along a direction perpendicular to the base substrate; and
   a material of a part of the second gate insulating layer proximal to the second active layer comprises an oxide, and a material of a part of the second source and drain insulating layer proximal to the second active layer comprises an oxide.

7. The transistor device according to claim 6, wherein a material of a part of the second gate insulating layer distal from the second active layer comprises a non-oxide, and a material of a part of the second source and drain insulating layer distal from the second active layer comprises a non-oxide.

8. A display substrate, comprising the transistor device as defined in claim 1.

9. A display device, comprising the display substrate as defined in claim 8.

10. A method for manufacturing a transistor device, comprising:
    forming a first transistor and a second transistor on a base substrate;
    wherein the first transistor comprises a first active layer, and the second transistor comprises a second gate, the first active layer and the second gate being in the same layer,
    wherein the first active layer and the second gate are manufactured in one patterning process, and forming the first transistor and the second transistor on the base substrate comprises:
    sequentially forming a polysilicon material layer and a conductor material layer on a base substrate when forming the first active layer and the second gate;
    obtaining a polysilicon pattern and a gate body by processing the polysilicon material layer and the conductor material layer in one patterning process; wherein the polysilicon pattern comprises a polysilicon block and an auxiliary polysilicon block that are spaced apart, the polysilicon block and the gate body being sequentially arranged along a direction perpendicular to the base substrate and away from the base substrate, and an orthographic projection of the polysilicon block on the base substrate coinciding with an orthographic projection of the gate body on the base substrate; and the second gate comprises the polysilicon block and the gate body; and obtaining the first active layer by doping a part of the auxiliary polysilicon block, wherein the first active layer comprises a first source region and a first drain region that are subjected to the doping treatment, and a first channel region not subjected to the doping treatment, the first source region, the first channel region, and the first drain region being sequentially arranged along a direction parallel to the base substrate.

11. The method according to claim 10, wherein obtaining the polysilicon pattern and the gate body by processing the polysilicon material layer and the conductor material layer in one patterning process comprises:

forming a first photoresist pattern on the base substrate on which the polysilicon material layer and the conductor material layer are formed, wherein the first photoresist pattern comprises a first photoresist area and a second photoresist area that are spaced apart, the first photoresist area being thinner than the second photoresist area;

obtaining a conductor pattern by removing a part of the conductor material layer not covered with the first photoresist pattern;

obtaining a polysilicon pattern by removing a part of the polysilicon material layer not covered with the first photoresist pattern;

obtaining a second photoresist pattern by removing the photoresist in the first photoresist area and thinning the photoresist in the second photoresist area;

obtaining the gate body by removing a part of the conductor pattern not covered with the second photoresist pattern; and removing the second photoresist pattern.

12. The method according to claim 10, wherein the first transistor further comprises a first gate, the second transistor further comprises a second active layer, and forming the first transistor and the second transistor on the base substrate further comprises:

prior to doping the part of the auxiliary polysilicon block, forming an oxide semiconductor material layer on the base substrate on which the polysilicon pattern and the gate body are formed;

forming a third photoresist pattern on the base substrate on which the oxide semiconductor material layer is formed, wherein the third photoresist pattern comprises a third photoresist area, a fourth photoresist area, a fifth photoresist area, and a sixth photoresist area, the third photoresist area and the fourth photoresist area being spaced apart, the fourth photoresist area, the fifth photoresist area and the sixth photoresist area being sequentially connected, the third photoresist area, the fourth photoresist area, and the sixth photoresist area having the same thickness, and the third photoresist area being thinner than the fifth photoresist area;

obtaining an oxide semiconductor pattern by removing a part of the oxide semiconductor material layer not covered with the third photoresist pattern;

obtaining a fourth photoresist pattern by removing the photoresist in the third photoresist area, the fourth photoresist area and the sixth photoresist area, and thinning the photoresist in the fifth photoresist area;

obtaining the first gate and the second active layer by reducing a part of the oxide semiconductor pattern not covered with the fourth photoresist pattern, wherein the second active layer comprises a second source region and a second drain region that are subjected to the reduction treatment, and a second channel region not subjected to the reduction treatment, the second source region, the second channel region and the second drain region being sequentially arranged along a direction parallel to the base substrate; and removing the fourth photoresist pattern;

doping the part of the auxiliary polysilicon block comprises:

after obtaining the oxide semiconductor pattern, doping the part of the auxiliary polysilicon block by taking the third photoresist pattern as a mask.

13. The method according to claim 10, wherein the first transistor further comprises a first source and drain, a first gate insulating layer and a first source and drain insulating layer, the second transistor further comprises a second source and drain, a second gate insulating layer and a second source and drain insulating layer, and forming the first transistor and the second transistor on the base substrate comprises:

forming a first insulating material layer on the base substrate when forming the first gate insulating layer and the second gate insulating layer, and obtaining the first gate insulating layer and the second gate insulating layer by processing the first insulating material layer in one patterning process;

forming a second insulating material layer on the base substrate when forming the first source and drain insulating layer and the second source and drain insulating layer, and obtaining the first source and drain insulating layer and the second source and drain insulating layer by processing the second insulating material layer in one patterning process; and forming a conductive material layer on the base substrate when forming the first source and drain and the second source and drain, and obtaining the first source and drain and the second source and drain by processing the conductive material layer in one patterning process.

14. The method according to claim 10, wherein the first transistor further comprises a first gate, and the second transistor further comprises a second active layer, the first gate and the second active layer being manufactured in one patterning process.

15. The method according to claim 14, wherein forming the first transistor and the second transistor on the base substrate comprises:

forming an oxide semiconductor material layer on the base substrate when forming the first gate and the second active layer;

obtaining an oxide semiconductor pattern by processing the oxide semiconductor material layer in one patterning process, wherein the oxide semiconductor pattern comprises a target semiconductor block and an auxiliary semiconductor block that are spaced apart; and obtaining the first gate and the second active layer by reducing a part of the target semiconductor block and the auxiliary semiconductor block, wherein the second active layer comprises a second source region and a second drain region that are subjected to the reduction treatment, and a second channel region not subjected to the reduction treatment, the second source region, the second channel region, and the second drain region being sequentially arranged along a direction parallel to the base substrate.

* * * * *